(12) United States Patent
Narita et al.

(10) Patent No.: US 7,552,528 B2
(45) Date of Patent: Jun. 30, 2009

(54) WAFER EXPANDING DEVICE, COMPONENT FEEDER, AND EXPANDING METHOD FOR WAFER SHEET

(75) Inventors: Shoriki Narita, Osaka (JP); Shuichi Hirata, Osaka (JP); Takafumi Tsujisawa, Osaka (JP); Hirokuni Miyazaki, Osaka (JP); Satoshi Shida, Osaka (JP)

(73) Assignee: Panasonic Corporation, Osaka (JP)

( * ) Notice: Subject to any disclaimer, the term of this patent is extended or adjusted under 35 U.S.C. 154(b) by 114 days.

(21) Appl. No.: 11/597,208

(22) PCT Filed: May 19, 2005

(86) PCT No.: PCT/JP2005/009165

§ 371 (c)(1),
(2), (4) Date: Nov. 21, 2006

(87) PCT Pub. No.: WO2005/114714

PCT Pub. Date: Dec. 1, 2005

(65) Prior Publication Data

US 2008/0010818 A1 Jan. 17, 2008

(30) Foreign Application Priority Data

May 24, 2004 (JP) .............................. 2004-153242

(51) Int. Cl.
*H01R 43/00* (2006.01)
*H01L 21/00* (2006.01)
(52) U.S. Cl. ............................. 29/825; 29/832; 29/840; 438/113; 438/114

(58) Field of Classification Search ................... 29/825, 29/832, 840; 438/113, 114
See application file for complete search history.

(56) References Cited

U.S. PATENT DOCUMENTS

| 5,882,956 | A  | * | 3/1999 | Umehara et al. | ............. 438/114 |
|-----------|----|---|--------|----------------|---------------------|
| 6,514,795 | B1 | * | 2/2003 | Jiang et al.   | ................... 438/113 |
| 6,894,380 | B2 | * | 5/2005 | Jiang et al.   | ................... 257/686 |
| 2006/0005911 | A1 | * | 1/2006 | Kubo et al. | .................... 156/84 |
| 2006/0012020 | A1 | * | 1/2006 | Gilleo     | ........................ 257/678 |

FOREIGN PATENT DOCUMENTS

| JP | 62-124911 | 6/1987 |
|----|-----------|--------|
| JP | 2-231740  | 9/1990 |
| JP | 7-321070  | 12/1995 |
| JP | 2002-334853 | 11/2002 |
| JP | 2005-109043 | 4/2005 |

* cited by examiner

*Primary Examiner*—C. J Arbes
(74) *Attorney, Agent, or Firm*—Wenderoth, Lind & Ponack, L.L.P.

(57) ABSTRACT

In slack removal processing for removing slack generated on a wafer sheet by heating blow, a wafer feeding plate is positioned at a height position between a first height position and a second height position. This makes it possible to decrease a gap between an upper end portion of an expanding ring and a lower face of the wafer sheet and allows efficient and uniform processing. Moreover, setting the height position so as to avoid the contact between the wafer sheet and the upper end portion of the expanding ring at least when the slack removal processing is completed reliably prevents shrinking operation of the wafer sheet from being disturbed by the contact between the wafer sheet and the upper end portion.

10 Claims, 27 Drawing Sheets

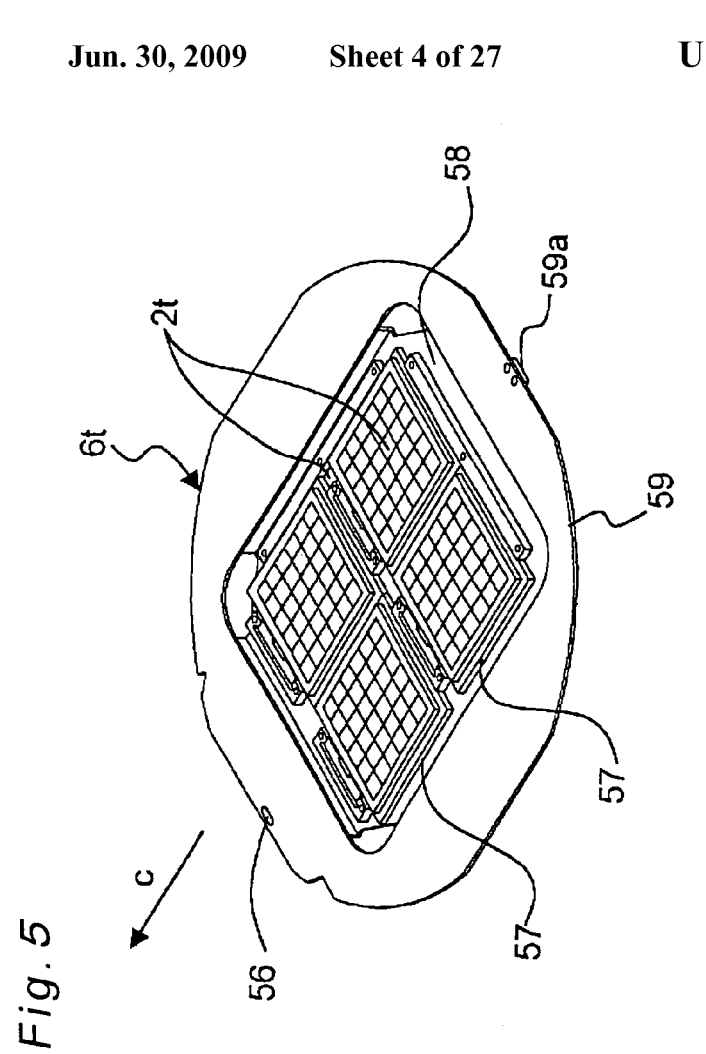
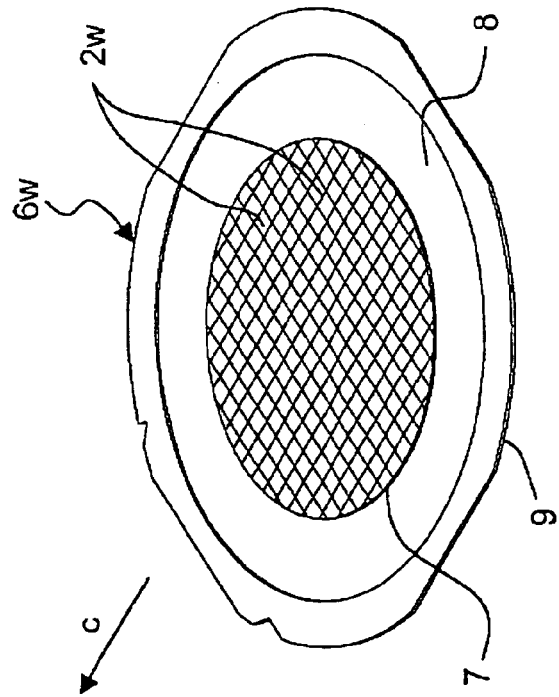

WAFER EXPANDING DEVICE, COMPONENT FEEDER, AND EXPANDING METHOD FOR WAFER SHEET

TECHNICAL FIELD

The present invention relates to a wafer expanding device, a component feeder and a wafer sheet expanding method for radially stretching a wafer sheet, on which a plurality of wafer feed components formed through dicing of a wafer is attached, over a wafer feeding plate which holds the wafer sheet for expansion and for making the respective wafer feed components feedable from the wafer sheet.

BACKGROUND ART

Wafer expanding devices of this kind have conventionally been known in various structures, such as Japanese Unexamined Patent Publication S62-124911. The wafer expanding operation by such conventional wafer expanding devices will be described with reference to schematic views shown in FIG. 28A and FIG. 28B.

As shown in FIG. 28A, a wafer feeding plate 506 holds a wafer sheet 508 on the top face of which a plurality of wafer feed components 502 formed through dicing of a wafer are attached, and in this held state, the wafer sheet 508 is kept in a substantially horizontal posture, without sagging, and with a specified tension applied thereto. It is to be noted that such a wafer feed component 502 is exemplified by an IC component.

Moreover, as shown in FIG. 28A, the wafer feeding plate 506 in such a state is fed to a component feeder 501 equipped with a wafer expanding device, so that the wafer feeding plate 506 is held by a plate holding member 561 at its peripheral portion.

Then, as shown in FIG. 28B, in the component feeder 501, the plate holding member 561 is lowered so as to lower the wafer feeding plate 506 and to bring the lower face of the wafer sheet 508 into contact with an upper end portion of an expanding ring 563 that is a substantially ring-shaped member disposed below the wafer sheet 508, and after the contact is made, the wafer feeding plate 506 is further lowered so as to stretch the wafer sheet 508 substantially radially. By this, the wafer attached onto the wafer sheet 508 is expanded.

In such expanded state, the plate holding member 561 is stopped from being lowered, and the lower face of the wafer sheet 508 is pushed up by a component push-up device 520 as shown in FIG. 28B, so that one wafer feed component 502 in the expanded state is separated from the wafer sheet 508 and is made feedable by a suction head and the like.

After the respective wafer feed components 502 are supplied from the wafer feeding plate 506, the plate holding member 561 is lifted and the expansion is cancelled. However, when such expansion is applied, even the wafer sheet 508 which can elastically deform to some degree cannot perfectly regain its original state, and as a result has some slack. With the presence of such slack, shaking and vibration are transmitted to the wafer feed components 502 remaining on the wafer sheet 508 during transportation of the wafer feeding plate 506, which may result in component damage. Moreover, there are cases in which the wafer feeding plate 506 is housed in a magazine cassette once the wafer feed components 502 on the wafer sheet 508 are removed, and if the wafer sheet 508 has slack in such cases, the wafer sheet 508 may be caught on a transportation unit or the like, which may cause a problem that smooth component feeding is disturbed.

In order to solve such a problem, in the conventional component feeder 501, slack of the wafer sheet 508 generated after the expansion is removed by shrinking the wafer sheet 508 with use of a heating blow. For applying such a heating blow, the component feeder 501 is equipped with a heating blower device 530 for applying the heated blow by heating and blowing compressed air. It is to be noted that such a heating blower device 530 is disposed in such a way that the compressed air is heated and blown from the inside of the expanding ring 563 to the lower face of the wafer sheet 508.

DISCLOSURE OF INVENTION

Problems to be Solved by the Invention

In such a conventional component feeder 501, the plate holding member 561 is lifted and lowered between a lower-limit height position of lifting and lowering for the expansion and an upper-limit height position of the lifting and lowering for cancellation of the expansion. Therefore, as shown in FIG. 29, in the state that the plate holding member 561 is positioned at the upper-limit height position of the lifting and lowering, removal of the slack generated on the wafer sheet 508 is performed on the held wafer feeding plate 506 by the heating blower device 530.

However, since the upper-limit height position of the lifting and lowering is also a height position at which the wafer feeding plate 506 is fed and discharged to the plate holding member 561, the height position is set so as to ensure prevention of interference between the fed or discharged wafer feeding plate 506 and the components constituting the component feeder 501 such as the expanding ring 563. Consequently, as shown in FIG. 29, a large gap is secured between the lower face of the wafer sheet 508 on the wafer feeding plate 506 positioned at the upper-limit height position of the lifting and lowering and the upper end portion of the expanding ring 563 for reliably preventing the interference. With the presence of such a large gap, when the heating blow is applied to the wafer sheet 508 by the heating blower device 530, the heated air is leaked to the outside of the expanding ring 563 through the gap, which may cause insufficient heating of the wafer sheet 508. In such a case, uneven heating of the wafer sheet 508 may occur, and the uneven heating causes uneven shrinkage of the wafer sheet 508, which results in a problem that complete removal of the slack generated on the wafer sheet 508 cannot always be achieved as shown in FIG. 30.

Particularly, the peripheral portion of the wafer sheet 508 tends to stretch more than its central portion, and therefore if the heated air is leaked from the gap, temperature in the peripheral portion becomes lower than that in the central portion, which makes occurrence of the uneven shrinkage more noticeable.

Moreover, with an increase in the diameter of wafers in recent years, the area of the wafer sheet 508 on which respective wafer feed components 502 are attached is being enlarged, and a quantity of heat by heated air transmitted to the wafer sheet 508 by the heating blower device 530 tends to be easily discharged from the respective wafer feed components 502, which makes it impossible to perform efficient heating under the condition that the heated air leaks from the gap, causing the problem that removal of the slack takes a longer time.

An object of the present invention is to provide, for solving the problems, a wafer expanding device allowing reliable and efficient removal of residual slack on a wafer sheet on which a plurality of wafer feed components formed by dicing of a wafer are attached, the slack generated by applying expansion to a wafer feeding plate which holds the wafer sheet, and to provide a component feeder having such a wafer expanding device and a wafer sheet expanding method.

Means for Solving the Problems

In order to achieve the above object, the present invention has the following constitutions.

According to a first aspect of the present invention, there is provided a wafer expanding device for performing expansion of a wafer sheet held by a wafer feeding plate and having a plurality of wafer feed components, which are formed through dicing of a wafer, attached thereto, and for making the respective wafer feed components feedable from the wafer sheet, comprising:

an expanding ring which is a ring-shaped member, for performing the expansion so as to expand the wafer sheet almost radially by depressing a lower face of the wafer sheet with ring-shaped upper end portion thereof;

a plate up/down device for holding the wafer feeding plate disposed above the expanding ring and for lowering the held wafer feeding plate relatively to the expanding ring so as to perform the expansion and for lifting the held wafer feeding plate relatively so as to cancel the expansion, and a heating blower device for blowing heated air from an inside of the expanding ring to the lower face of the wafer sheet in an expansion cancelled state so as to remove slack on the wafer sheet generated by the expansion, wherein the plate up/down device holds the wafer feeding plate at respective up/down height positions including;

a first height position for feeding and discharging the wafer feeding plate with preventing interference with the expanding ring, a second height position for expanding the wafer feeding plate, and a third height position, which is a height position for canceling the expansion and removing the slack of the wafer sheet by the heating blower device and which is also a height position for avoiding contact between the wafer sheet and the upper end portion of the expanding ring when removal of the slack is completed.

According to a second aspect of the present invention, there is provided the wafer expanding device as defined in the first aspect, wherein the plate up/down device disposes the wafer feeding plate at the slack removal position so as to form a gap between the wafer sheet and the upper end portion of the expanding ring when removal of the slack is completed, the gap being so set as to allow contact between the wafer sheet and the upper end portion of the expanding ring to be avoided and to allow prevention of heated air supplied by the heating blower device into a space almost enclosed with the wafer sheet and the expanding ring from leaking to an outside of the expanding ring.

According to a third aspect of the present invention, there is provided the wafer expanding device as defined in the second aspect, wherein the ring-shaped upper end portion of the expanding ring has a shape bent toward an inside of the ring in such a way as to allow prevention of a heated blow atmosphere inside the space from leaking through the gap.

According to a fourth aspect of the present invention, there is provided the wafer expanding device as defined in the second aspect, wherein the gap is set in a range of 0.2 mm to 1.5 mm.

According to a fifth aspect of the present invention, there is provided the wafer expanding device as defined in the first aspect, wherein the plate up/down device comprises:

a plurality of elastic support members for supporting the wafer feeding plate disposed at the first height position from a lower face portion in a vicinity of its outer peripheral portion and which have variable supporting positions thereof;

a plate presser member for pressing the wafer feeding plate supported by the respective elastic support members from an upper face side in a vicinity of its outer peripheral portion in such a way that the wafer feeding plate is interposed in between the respective elastic support members;

a presser member up/down unit for lifting and lowering the plate presser member so that the wafer feeding plate held by the plate presser member is lifted and lowered between the first height position and the second height position, and a regulating member for selectively regulating up/down positions of the plate presser member lifted and lowered by the presser member up/down unit between the first height position and the second height position so that the wafer feeding plate held by the plate presser member is positioned at the third height position.

According to a sixth aspect of the present invention, there is provided a component feeder for housing a plurality of components to be mounted on a board and feeding the respective housed components in such a way as to allow component mounting, comprising:

a plate storage device for retrievably housing a plurality of wafer feeding plates for carrying the wafers on which a plurality of the wafer feed components among the components are disposed and a plurality of tray feeding plates for carrying component feeding trays on which a plurality of tray feed components are disposed;

a plate placement device for selectively placing and holding any one of the respective plates and for making the respective wafer feed components from the wafer or the tray feed components from the component feeding tray feedable, and a plate moving device for releasably holding the plate so as to extract the plate from the plate storage device and for retainably moving the plate to the plate placement device, wherein the plate placement device comprises the wafer expanding device as defined in the fifth aspect for holding the respective plates for lowering and lifting, and when the tray feeding plate is disposed, the plate placement device regulates a lowering position of the plate presser member with the regulating member so as to position the tray feeding plate held by the plate presser member at the third height position, and makes the respective tray feed components from the tray feeding plate feedable.

According to a seventh aspect of the present invention, there is provided the component feeder as defined in the sixth aspect, wherein the plate storage device houses expanded wafer feeding plates for carrying expanded wafers, and when the expanded wafer feeding plate is placed, the plate placement device regulates a lowering position of the plate presser member with the regulating section to position the expanded wafer feeding plate held by the plate presser member at the third height position, and makes the respective wafer feed components from the plate feedable.

According to an eighth aspect of the present invention, there is provided an expanding method for wafer sheet comprising:

disposing a wafer feeding plate, which holds a wafer sheet on which a plurality of wafer feed components formed through dicing of a wafer are attached, at a first height position that is a position above an expanding ring that is a ring-shaped member;

feedably expanding the respective wafer feed components by lowering the wafer feeding plate relatively to the expanding ring so as to position the wafer feeding plate at a second height position, and relatively pressing the wafer sheet in a state that the wafer sheet is in contact with an upper end portion of the expanding ring so as to expand the wafer sheet almost radially;

canceling the expansion by lifting the wafer feeding plate relatively to the expanding ring so as to position the wafer feeding plate at a third height position that is a height position between the first height position and the second height position, and performing a removal processing of slack on the wafer sheet by applying heating blow to a lower face of the wafer sheet from an inside of the expanding ring at the third height position so as to avoid contact between the wafer sheet and an upper end portion of the expanding ring at least when removal of slack generated on the wafer sheet by the expansion is completed.

According to a ninth aspect of the present invention, there is provided the expanding method for wafer sheet as defined in the eighth aspect, wherein in the removal processing of slack on the wafer sheet, contact between the wafer sheet and the expanding ring is avoided by generating a gap between the wafer sheet on the wafer feeding plate retained at the second height position and the upper end portion of the expanding ring, the gap being so set as to prevent air heated by the heating blow and supplied into a space almost enclosed with the wafer sheet on the wafer feeding plate and the expanding ring from leaking to an outside of the expanding ring.

According to a tenth aspect of the present invention, there is provided the expanding method for wafer sheet as defined in the ninth aspect, wherein the gap is set in a range of 0.2 mm to 1.5 mm.

Effects of the Invention

According to the first aspect of the present invention, at the time of the slack removal processing for removing the slack, which are generated on the wafer sheet due to the expansion, by heating blow from the heating blower device, positioning the wafer feeding plate at a height position between the plate feeding height position and the second height position with the plate up/down device allows a distance between the upper end portion of the expanding ring and the lower face of the wafer sheet to be sufficiently smaller than the distance in the case where the wafer feeding plate is positioned at the plate feeding height position. Therefore, it becomes possible to reduce an amount of heated air supplied by the heating blower device and leaking from an interval between the upper end portion of the expanding ring and the lower face of the wafer sheet, enhance heating efficiency to heat the wafer sheet and reduce a time necessary for the slack removal processing. Further, it becomes possible to make the temperature of the wafer sheet almost uniform, thereby allowing reduction of uneven heating.

Moreover, the height position is so set as to avoid the contact between the wafer sheet and the upper end portion of the expanding ring at least when the slack removal processing is completed, which can reliably prevent the shrinking operation of the wafer sheet by the heating blow from being disturbed by the contact with the upper end portion of the expanding ring. Therefore, it becomes possible to reduce uneven heating and uneven shrinkage and to perform the slack removal processing efficiently and evenly.

Moreover, according to another aspect of the present invention, a gap between the upper end portion of the expanding ring and the wafer sheet is determined in consideration of suppression of leakage of heated air supplied by the heating blower device, which makes it possible to reliably implement the efficient and uniform slack removal processing.

Moreover, the upper end portion of the expanding ring has a shape bent toward the inside of the ring, which allows further suppression of leakage of the heated air from the gap.

Moreover, the smaller the gap is, the more efficient the heating becomes because leakage of the heated air from the gap can be suppressed. However, in the case where the upper end portion of the expanding ring comes into contact with the wafer sheet during execution of the slack removal processing (from the start to the end of processing), there are such problems that heat is drawn from the heated wafer sheet to the expanding ring, resulting in processing in longer time and that the wafer sheet during the shrinkage process is caught on the upper end portion of the expanding ring and the shrinkage is disturbed. Consequently, at least when the slack removal processing is completed, a gap in the range of 0.2 to 1.5 mm or a gap corresponding to the gap of this size range is provided.

Moreover, such a third height position is so set as to serve also as a height position for allowing tray feed components to be fed from the tray feeding plate, which makes it possible to provide a component feeder capable of implementing the effects achieved by the respective aspects while simplifying their structures without the necessity of setting a new height position in the plate placement device.

BRIEF DESCRIPTION OF DRAWINGS

These and other aspects and features of the present invention will become clear from the following description taken in conjunction with the preferred embodiments thereof with reference to the accompanying drawings, in which:

FIG. 4 is a perspective view showing a wafer feeding plate handled in the component feeder;

FIG. 5 is a perspective view showing a tray feeding plate handled in the component feeder;

DETAILED DESCRIPTION OF THE INVENTION

Figure 1:
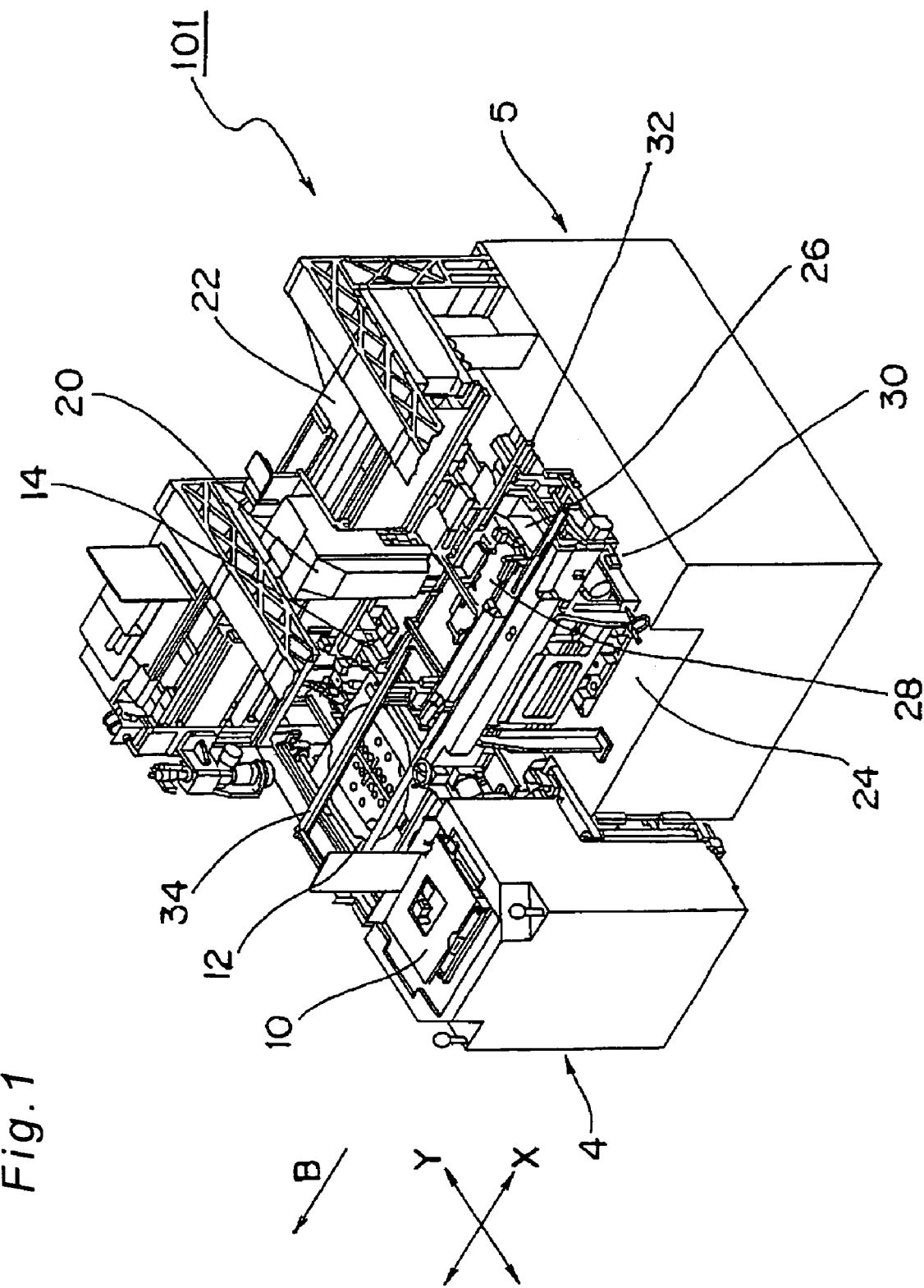
FIG. 1 is a perspective view showing an electric component mounting apparatus according to a first embodiment of the present invention.

Before the description of the present invention proceeds, it is to be noted that like parts are designated by like reference numerals throughout the accompanying drawings.

Hereinbelow, embodiments of the present invention will be described in detail with reference to the accompanying drawings.

First Embodiment

FIG. 1 is an external perspective view showing an electric component mounting apparatus 101 exemplifying a component mounting apparatus having a component feeder 4 exemplifying a component feeder for mounting components fed from the component feeder 4 on a board according to a first embodiment of the present invention. Before the specific structure and operation of the component feeder 4 will be described, the overall structure and operation of the electric component mounting apparatus 101 having such a component feeder 4 will be described with reference to FIG. 1.

(Electric Component Mounting Apparatus)

As shown in FIG. 1, the electric component mounting apparatus 101 is an apparatus which executes mounting operation for mounting electric components 2 exemplifying components such as chip components and bare IC chips on the board, and which mainly includes a component feeder 4 for feedably housing a plurality of the electric components 2 and a mounting section 5 executing mounting operation for mounting respective electronic components 2 fed from the component feeder 4 on the board.

The component feeder 4 shown in FIG. 1 has a lifter device 10 exemplifying a plate storage device which houses, in such a way as to allow selective feeding and in a consolidated manner, a wafer feeding plate carrying, on its upper face, a wafer on which a plurality of the wafer feed components 2w (exemplifying components) among a plurality of the electronic components 2 mounted on the board are disposed and a tray feeding plate for carrying, on its upper face, a plurality of component feeding trays on which a plurality of tray feed components (2t) (exemplifying components) among a number of electronic components 2 are disposed in the state of being arrayed in a grid-like state, the lifter device 10 being disposed on the front side in Y axis direction as viewed in the drawing in the component feeder 4. It is to be noted that in the following description, unless the wafer feeding plate or the tray feeding plate is specifically used, they are referred to as respective plates, and unless the wafer feed components 2w or the tray feed components 2t are specifically used, they are referred to as the electronic components 2. It is to be noted that the structure of the respective plates and the like will be described later. Moreover, the wafer feed components 2w are typified by bare IC chips formed by dicing of a wafer, and the tray feed components 2t include the IC chips, IC chips other than the bare IC chips (e.g., packaged IC chips and the like) and chip components.

Moreover, the component feeder 4 has a plate placement device 12 which places the respective plates selectively fed from the lifter device 10 in a state that the electric component 2 can be extracted from the respective plates. It is to be noted that when the wafer feeding plate is fed from the lifter device 10 and placed on the plate placement device 12, a wafer carried by the wafer feeding plate is subjected to expanding operation in the plate placement device 12.

Further, the component feeder 4 has an inverting head unit 14 for separately sucking and holding the electronic components 2 from the wafer placed on the plate or the component feeding tray selectively placed on the plate placement device 12, moving them toward the mounting section 5 along X axis direction as viewed in the drawing, and inverting the sucked and held electronic components 2 in a vertical direction. It is to be noted that instead of the structure in which the component feeder 4 has such an inverting head unit 14, the structure in which the electric component mounting apparatus 101 has an inverting head unit 14 which is a device independent of the component feeder 4, as well as the component feeder 4 may be adopted.

Moreover, as shown in FIG. 1, the mounting section 5 has a mounting head unit 20 for sucking and holding the electronic components 2 and mounting them on a board. Moreover, the mounting section 5 further has an X-axis robot 22 exemplifying a moving device which moves the mounting head unit 20 back and forth along X axis direction as viewed in the drawing while supporting the mounting head unit 20 between a component feeding position which is the position allowing the electric component 2 held by the inverting head unit 14 to be delivered to the mounting head unit 20 and a board mounting region in which mounting operation for mounting the electric component 2 on the board is performed, both the positions being placed along X axis direction as viewed in the drawing.

It is to be noted that the mounting head unit 20 has a holding part (unshown) structured to be driven to ascend and descend by a moving means such as voice coil motors and to be able to impart junction energy such as pressing energy, ultrasonic vibration energy and heat energy to a joint portion between the electric component 2 and the board through the sucked and held electric component 2, which makes it possible to impart the junction energy while pressing the electric component 2 toward the board. Moreover, the X-axis robot 22 has, for example, a moving mechanism (unshown) using a ball screw shaft and a nut engaged with the ball screw shaft.

Moreover, as shown in FIG. 1, on a base 24 of the mounting section 5 below the mounting head unit 20 and the X-axis robot 22, an XY table 26 is disposed. The XY table 26 can move a board in X axis direction and Y axis direction as viewed in the drawing and determines a position to mount the electric component 2 on the board with respect to the mounting head unit 20. The XY table 26 is driven to move in both X axis direction and Y axis direction as viewed in the drawing by, for example, a servo motor, and is capable of being positioned by full close control with use of a linear scale. Further, a board holding table 28 for releasably holding and fixing the board is disposed on the upper face of the XY table 26. It is to be noted that in FIG. 1, the X axis direction and the Y axis direction are directions along the surface of the board and orthogonal to each other.

Moreover, as shown in FIG. 1, the electric component mounting apparatus 101 has a board conveyance unit 30 at an end portion of the front side in Y axis direction as viewed in the drawing on the top face of the base 24 for transporting boards along a board conveyance direction B that is a direction toward the left-hand side in X axis direction as viewed in the drawing to feed and discharge boards to/from the board holding table 28. The board conveyance unit 30 has a loader 32 exemplifying a loader unit which transports and feeds boards from the end portion of the electric component mounting apparatus 101 on the right-hand side in X axis direction as viewed in the drawing to the board holding table 28 on the XY table 26, and an unloader 34 exemplifying an unloader unit which transports and discharges boards from the board holding table 28 to an end portion of the electric component mounting apparatus 101 on the left-hand side in X direction as viewed in the drawing. It is to be noted that in the present embodiment, the XY table 26 in the electric component mounting apparatus 101 also functions as a board holding and moving unit included in the board conveyance unit 30. Moreover, the XY table 26 and the board holding table 28 exemplify the board holding and moving unit for moving and holding boards. Moreover, instead of such structure, the structure in which board conveyance unit 30 has a board holding and moving unit independent of the XY table 26 in the electric component mounting apparatus 101 may be adopted.

It is to be noted that FIG. 1 is an external perspective view showing the electric component mounting apparatus 101 in the state that a casing cover covering the entire upper face of the base 24 is removed for the sake of convenience for description of the structure.

Description is now given of the mounting operation for mounting the electronic components 2 on a board in the electric component mounting apparatus 101 having such structure.

In the electric component mounting apparatus 101 in FIG. 1, the board holding table 28 is moved to the XY table 26 so as to be positioned between the loader 32 and the unloader 34 on the base 24. At the same time, a board on which respective electronic components 2 are to be mounted in the electric component mounting apparatus 101 is fed to the loader 32 in the board conveyance unit 30 from, for example, a device adjacent to the electric component mounting apparatus 101 and the like, and the loader 32 transports the board in the board conveyance direction B, by which the board is fed to and held by the board holding table 28. Then, the XY table 26 is moved in X axis direction or Y axis direction as viewed in the drawing so that the board is moved to the board mounting region.

In the component feeder 4, one plate is selected and extracted from various plates housed in the lifter device 10, and is placed on the plate placement device 12. Then, an electric component 2 is extracted from the placed plate in the state of being sucked and held by the inverting head unit 14, and the electric component 2 is inverted and moved to the component feeding position. Moreover, in the mounting section 5, the mounting head unit 20 is moved by the X-axis robot 22 to the component feeding position, so that the electric component 2 is delivered from the inverting head unit 14 to the mounting head unit 20. Then, the mounting head unit 20 in the state of sucking and holding the delivered electric component 2 is moved to the upper side of the board mounting region by the X-axis robot 22.

After that, positioning to align the electric component 2 sucked and held by the mounting head unit 20 with the position on the board held by the board holding table 28 at which the electric component 3 should be mounted is performed by movement of the XY table 26. After the positioning, up/down operation of the mounting head unit 20 or the like is performed to achieve mounting operation to mount the electric component 2 on the board. In the case where the mounting operation of a plurality of the electronic components 2 is performed, the respective operations are repeatedly performed to achieve the mounting operation of the respective electronic components 2.

Then, after the mounting operation of the respective electronic components 2 is finished, the board with the respective electronic components 2 mounted thereon is moved together with the board holding table 28 by the XY table 26 to the position between the loader 32 and the unloader 34, delivered by the board holding table 28 to the unloader 34, transported by the unloader 34 along the board conveyance direction B, and is discharged out of the electric component mounting apparatus 101. The discharged board is fed to, for example, to a device disposed adjacent to the electric component mounting apparatus 101 for performing the processing following the component mounting and the like, or is housed in a board housing device and the like as a component mounted board.

Thus, in the electric component mounting apparatus 101, the mounting operation to mount the respective electric component 2 on a board is performed. It is to be noted that after the board with the respective electronic components 2 mounted thereon is discharged by the unloader 34, a new board is fed by the loader 32, so that respective electronic components 2 are mounted on respective boards fed in sequence.

(Component Feeder)

Next, the specific structure of the component feeder 4 included in the electric component mounting apparatus 101 having such structure and component mounting operation will be described centering particularly on the lifter device 10, the plate placement device 12 and the structure relating thereto. Also, FIG. 2 is a semi-transparent perspective view showing the lifter device 10 and the plate placement device 12 in such a component feeder 4.

Figure 2:
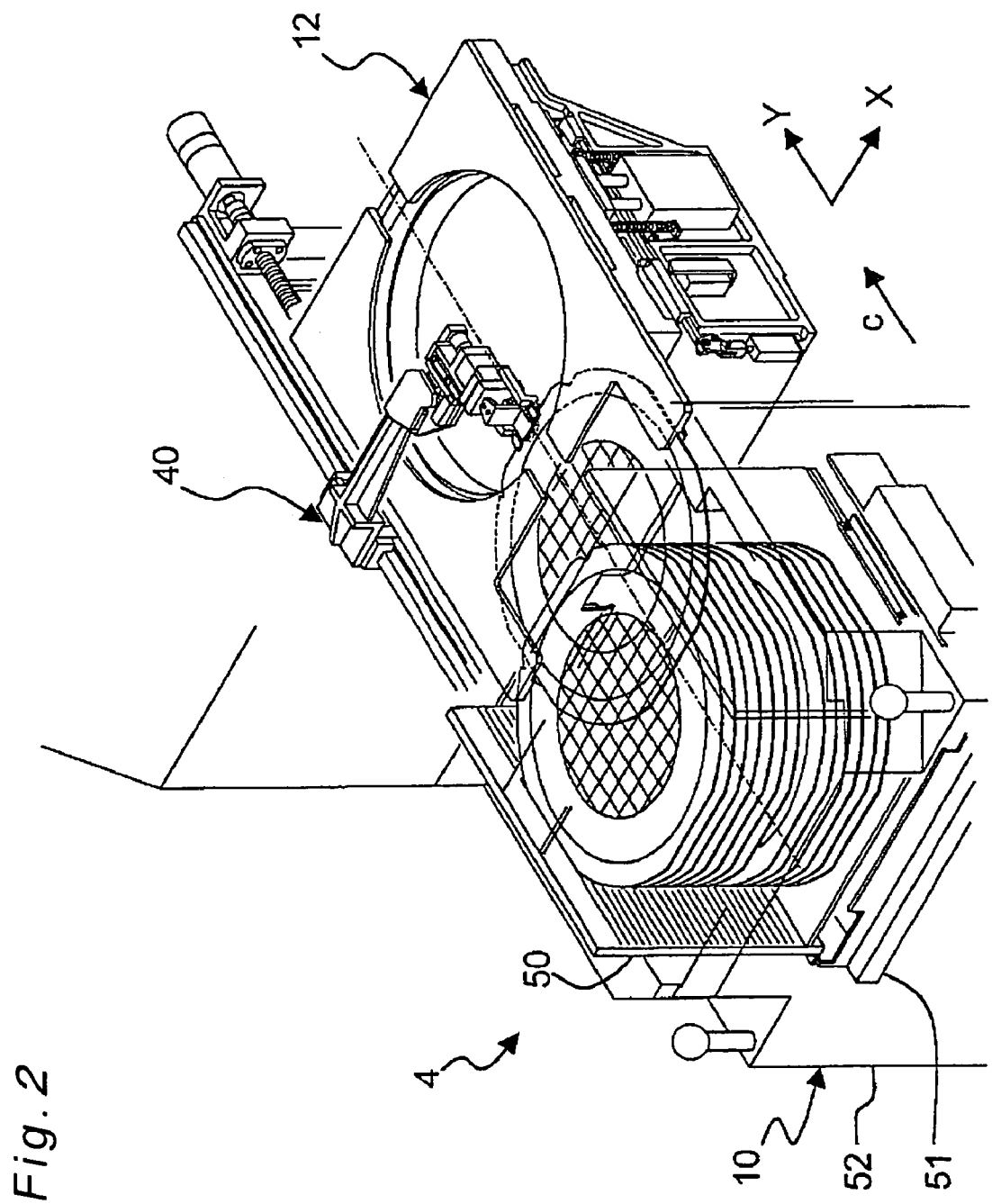
FIG. 2 is an enlarged semi-transparent perspective view showing a component feeder included in the electric component mounting apparatus in FIG. 1.

As shown in FIG. 2, the component feeder 4 has, in addition to the above-stated lifter device 10 and plate placement device 12, a plate moving device 40 for holding and extracting respective plates housed in the lifter device 10 and moving the plates so as to be placed on the plate placement device 12. Moreover, the plate moving device 40 can move the plates so as to hold the plates placed on the plate placement device 12 and house them in the lifter device 10 again.

First, the lifter device 10 is composed of a magazine cassette 50 exemplifying a receiver having a box shape which houses a plurality of the wafer feeding plates and a plurality of the tray feeding plates stacked in vertical direction in a consolidated state, a cassette up/down unit 51 for supporting the magazine cassette 50 and performing up/down operation of the magazine cassette 50 to position one plate out of the respective plates housed in the magazine cassette 50 at a up/down height position which allows the plate moving device 40 to extract the plate, and a base 52 to which the cassette up/down unit 51 is attached and which can guide the up/down operation performed on the magazine cassette 50 by the cassette up/down unit 51.

Figure 3:
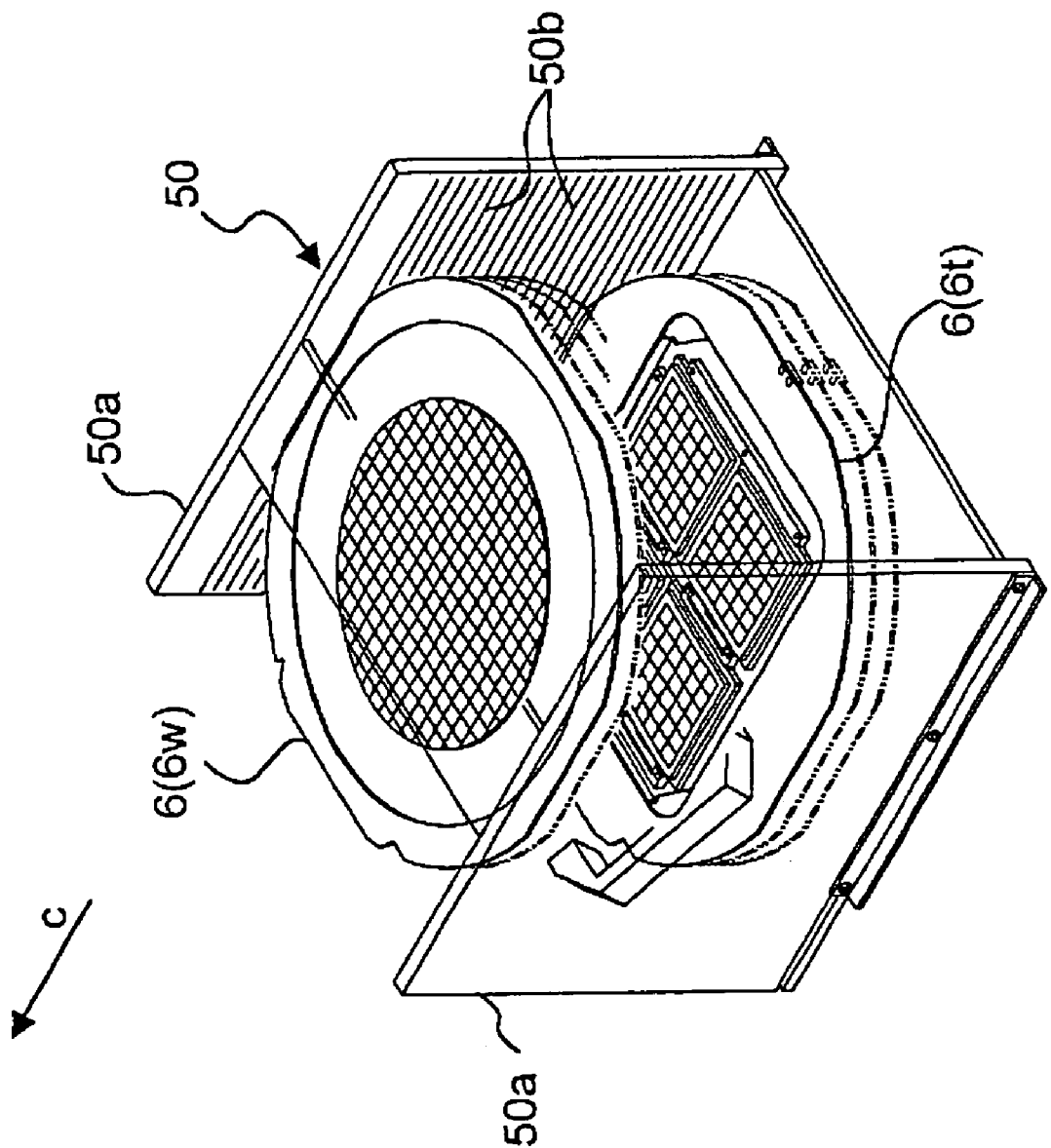
FIG. 3 is an enlarged semi-transparent perspective view showing a magazine set in a lifter device in the component feeder.

Herein, an enlarged perspective view (semi-transparent perspective view) of the magazine cassette 50 is shown in FIG. 3. As shown in FIG. 3, in the magazine cassette 50, a direction C as viewed in the drawing is a direction to extract the respective plates toward the plate placement device 12 (hereinbelow referred to as plate extraction direction C). Moreover, in the magazine cassette 50, side wall portion 50a are respectively provided facing each other in a direction orthogonal to the plate extraction direction C, and a plurality of recess portions 50b are formed along the plate extraction direction on both the lateral faces of the respective side wall portion 50a facing each other. The respective plates (hereinbelow referred to as plates 6) are held and stored in the magazine cassette 50 when both end portions of the plates 6 facing each other are engaged with the recess portions 50b on the respective side wall portion 50a. It is to be noted that the respective recess portions 50b on the respective side wall portion 50a are formed with an even interval pitch, and the surfaces of the plates 6 are almost horizontal state when the plates 6 are engaged with the respective recess portions 50b and held thereby. Further, the respective plates 6 are in a state capable of making forward and backward movement (i.e., sliding movement) along the plate extraction direction while being guided along the formation direction of the respective recess portions 50b. Moreover, since extraction of the respective housed plates 6 is performed in the magazine cassette 50, side wall portions are not provided on the plate extraction direction C sides so as not to disturb the extracting operation, and the plate extraction direction C sides are constantly in an open state. It is to be noted that in FIG. 3, the plates 6 housed on the upper side as viewed in the drawing denote wafer feeding plates 6w and the plates 6 housed on the lower side as viewed in the drawing denote tray feeding plates 6t.

Next, a perspective view of the wafer feeding plate 6w will be shown in FIG. 4 and a perspective view of the tray feeding plate 6t will be shown in FIG. 5 to describe the structure of the respective plates.

As shown in FIG. 4, the wafer feeding plate 6w has an almost disc-like shape having an outer peripheral portion formed of a linear portion and a curved portion. Moreover, respective end portions facing each other with the plate extraction direction C interposed therebetween form the linear-shaped outer peripheral portion as it is considered that these portions are engaged with the respective recess portions 50b of the magazine cassette 50. Moreover, as shown in FIG. 4, the wafer feeding plate 6w is an expandable-and-contractible sheet includes a wafer sheet 8 with a diced wafer 7 being attached and placed on its upper face, and a wafer ring 9 which is a ring-shaped plate for holding the wafer sheet 8 in the vicinity of its outer-peripheral end portion so that the wafer 7 is positioned inside the ring. With the thus-formed wafer feeding plate 6w, radially expanding the wafer sheet 8 makes it possible to radially expand the disposed positions of respective wafer feed components 2w disposed in a grid state, thereby allowing execution of so-called expansion.

In the meanwhile, as shown in FIG. 5, the tray feeding plate 6t has an outer diameter shape identical to the above-stated wafer feeding plate 6w. As a result of this, it is practicable to compositely place and store the wafer feeding plate 6w and the tray feeding plate 6t in a common magazine cassette 50. Moreover, as shown in FIG. 5, the tray feeding plate 6t includes a tray ring 59 which is a ring-shaped plate having an outer peripheral shape almost identical to the wafer ring 9 and having an inner peripheral hole portion in an almost square shape, and a tray placement portion 58 formed in the state of being fitted into the inner peripheral hole of the tray ring 59 for removably carrying a plurality of component feeding trays 57. The tray placement portion 58 is formed so as to be one-step lower than the surface of the tray ring 59, that is, the tray placement portion 58 is formed so that when the component feeding trays 57 are placed thereon, the upper face height position of the respective tray feed components 2t housed in the pertinent component feeding trays 57 is almost identical to the surface height position of the tray ring 59. With such formation, the height position of the tray feed components 2t on the tray feeding plate 6t is made almost identical to the height position of the wafer feed components 2w on the wafer feeding plate 6w. It is to be noted that in FIG. 5, four component feeding trays 57 in an almost square planar shape are placed on the tray placement portion 58 in the state of being arrayed in two lines. It is to be noted that instead of the structure in which the tray placement portion 58 is formed separately from the tray ring 59 and is fitted into the inside of the tray ring 59, the structure in which the tray placement portion 58 is integrally formed with the tray ring 59 is also adoptable. Moreover, as shown in FIG. 5, a position in the vicinity of the end portion of the tray ring 59 on the plate extraction direction C side on the tray feeding plate 6t is a position where the tray feeding plate 6t is held by the plate moving device 40, and an identification hole 56 for identifying the tray feeding plate 6t is also formed at this portion. It is to be noted that in the wafer feeding plate 6w in FIG. 4, the pertinent portion is also the holding position though the identification hole 56 for identification is not provided. This is because the presence of the identification hole 56 is used to identify the tray feeding plate 6t and the wafer feeding plate 6w as described later.

Figure 6:
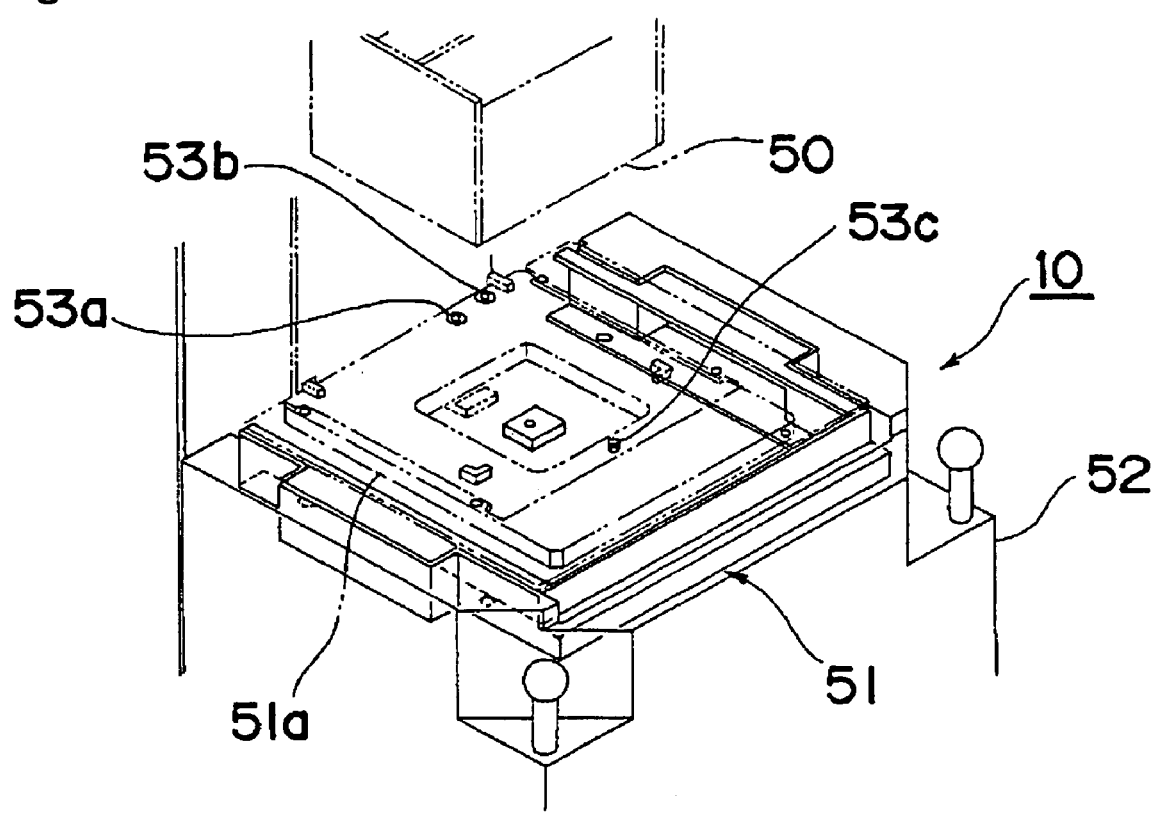
FIG. 6 is a perspective view showing a cassette up/down unit in the lifter device.

Further, as shown in FIG. 6, the cassette up/down unit 51 in the lifter device 10 has a cassette support table 51a for holding the magazine cassette 50 in the state of being disposed on its upper face. The magazine cassettes 50 handled by the lifter device 10 are in a plurality of sizes including, for example, 6-inch size, 8-inch size and 12-inch size. In order to detect the size difference among the respective magazine cassettes 50, a 6-inch cassette detection sensor 53a, an 8-inch cassette sensor 53b and a 12-inch cassette sensor 53c capable of detecting the size of a disposed magazine cassette 50 by detecting the difference in planar size of the respective magazine cassettes 50 are respectively disposed on the top face of the cassette support table 51a.

Figure 7:
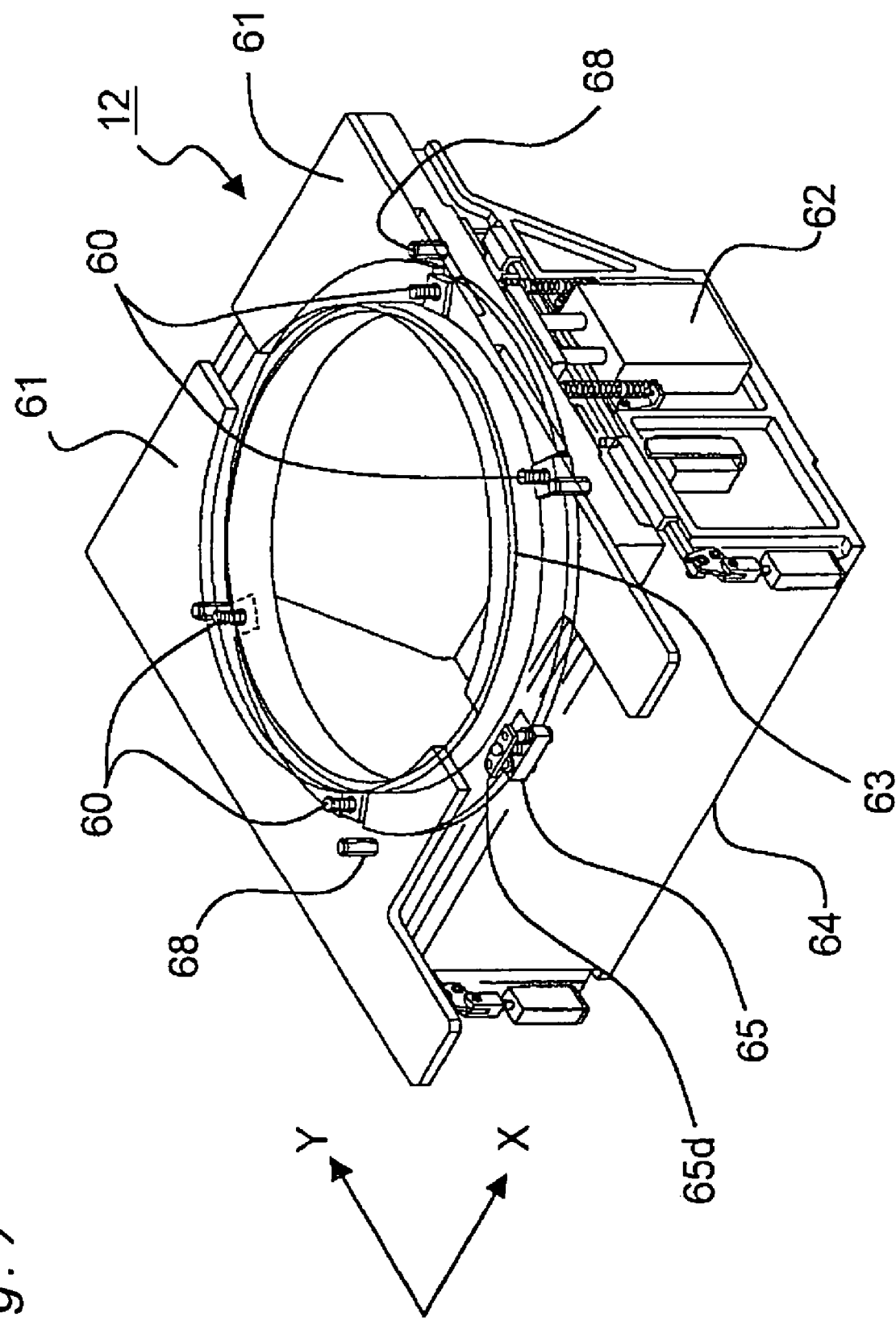
FIG. 7 is a perspective view showing a plate placement device in the component feeder.

Next, a semi-transparent perspective view of the plate placement device 12 is shown in FIG. 7. As shown in FIG. 7, the plate placement device 12 includes plate support portions 60 exemplifying a plurality of elastic support members capable of supporting a disposed plate 6 from the lower face side in the vicinity of its outer peripheral portion and capable of changing their support height positions, a plate presser member 61 for pressing the plate 6 supported by these plate support portions 60 from the top face side in the vicinity of the outer peripheral portion in such a way as to pinch the plate 6 with the top ends of the respective plate support portions 60 for retaining the supported position of the plate 6, and a presser member up/down unit 62 for executing up/down operation of the plate presser member 61.

Moreover, as shown in FIG. 7, the plate presser member 61 is a pair of plate-shaped members in a symmetric shape having semicircular notch portions disposed facing each other in the same plane. Moreover, since the semicircular notch portions are formed in this way, the lower face of the respective plate presser members 61 can come into contact only with the upper face of the wafer ring 9 of the wafer feeding plate 6w to press it, and the lower face of the respective plate presser members 61 can also come into contact only with the upper face of the tray ring 59 of the tray feeding plate 6t to press it. Moreover, the plate placement device 12 has, for example, four plate support portions 60, which are respectively disposed below the portions of the respective plate presser members 61 which press the wafer ring 9 or the tray ring 59. This enables the respective plate support portions 60 to support the wafer ring 9 and the tray ring 59 from the side of the respective lower faces. It is to be noted that the respective plate support portions 60 should preferably be disposed at almost even intervals along the outer periphery of the wafer ring 9 or the tray ring 59 disposed above. Moreover, as shown in FIG. 7, the plate placement device 12 has, on the left-hand side in Y axis direction as viewed in the drawing in the vicinity of the circumference on which the respective plate support portions 60 are disposed, a taper support unit 65 exemplifying another elastic support member having a taper-shaped inclined end portion formed in its top end portion on the side of its upper end, the taper-shaped inclined end portion being brought into contact with the end portion of the plate 6.

The plate placement device 12 is further composed of an expanding member 63 having a ring-shaped contact portion formed on its top end which can come into contact with the lower face of the wafer sheet 8 between the outer circumference of the wafer 7 and the inner periphery of the wafer ring 9 on the wafer feeding plate 6w with the wafer ring 9 supported by the respective plate support portions 60, and a placement frame 64 for fixing and supporting the expanding member 63 on its upper face. It is to be noted that in the plate placement device 12, two presser member up/down units 62 are mounted on the placement frame 64, that is, on respective side faces of the placement frame 64 in X axis direction in FIG. 7. Moreover, the respective presser member up/down units 62 integrally perform the up/down operation of the respective plate presser members 61.

Figure 8:
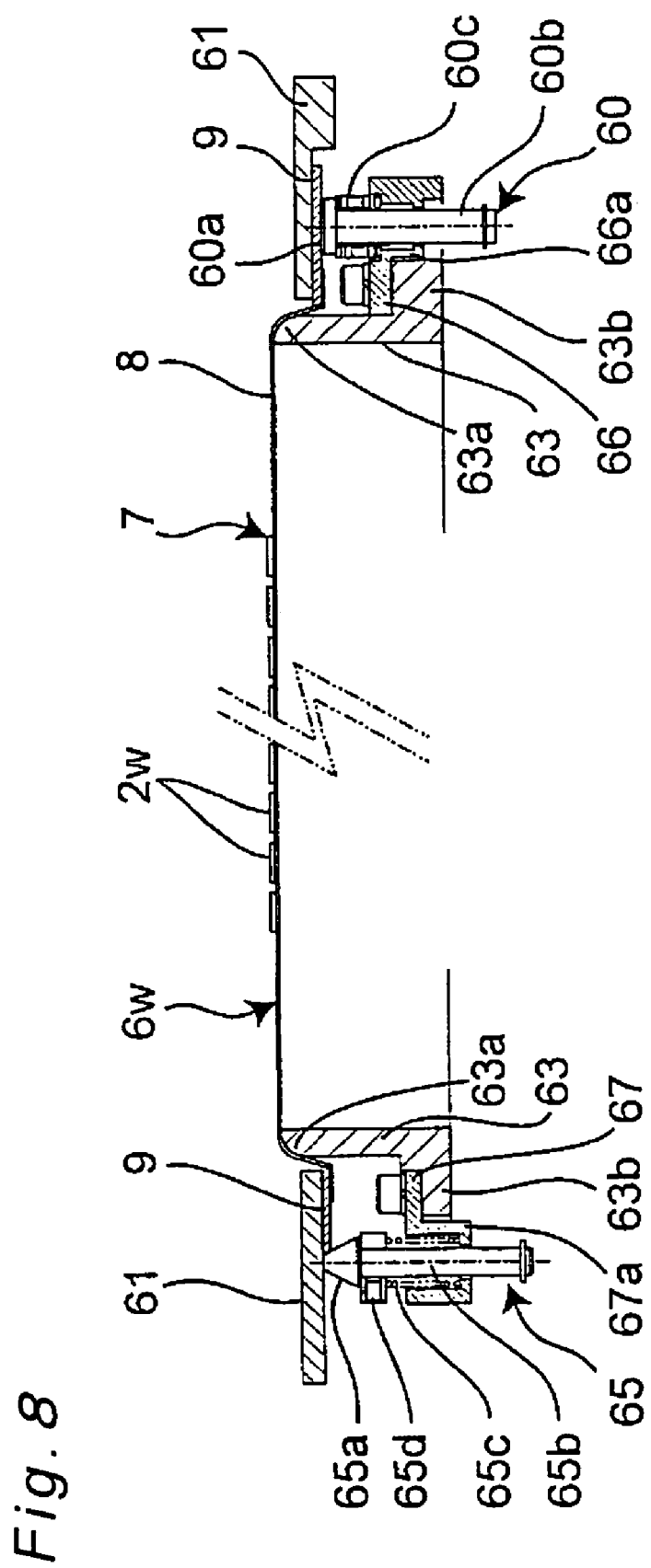
FIG. 8 is a cross sectional view showing the wafer feeding plate placed in the plate placement device.
Figure 9:
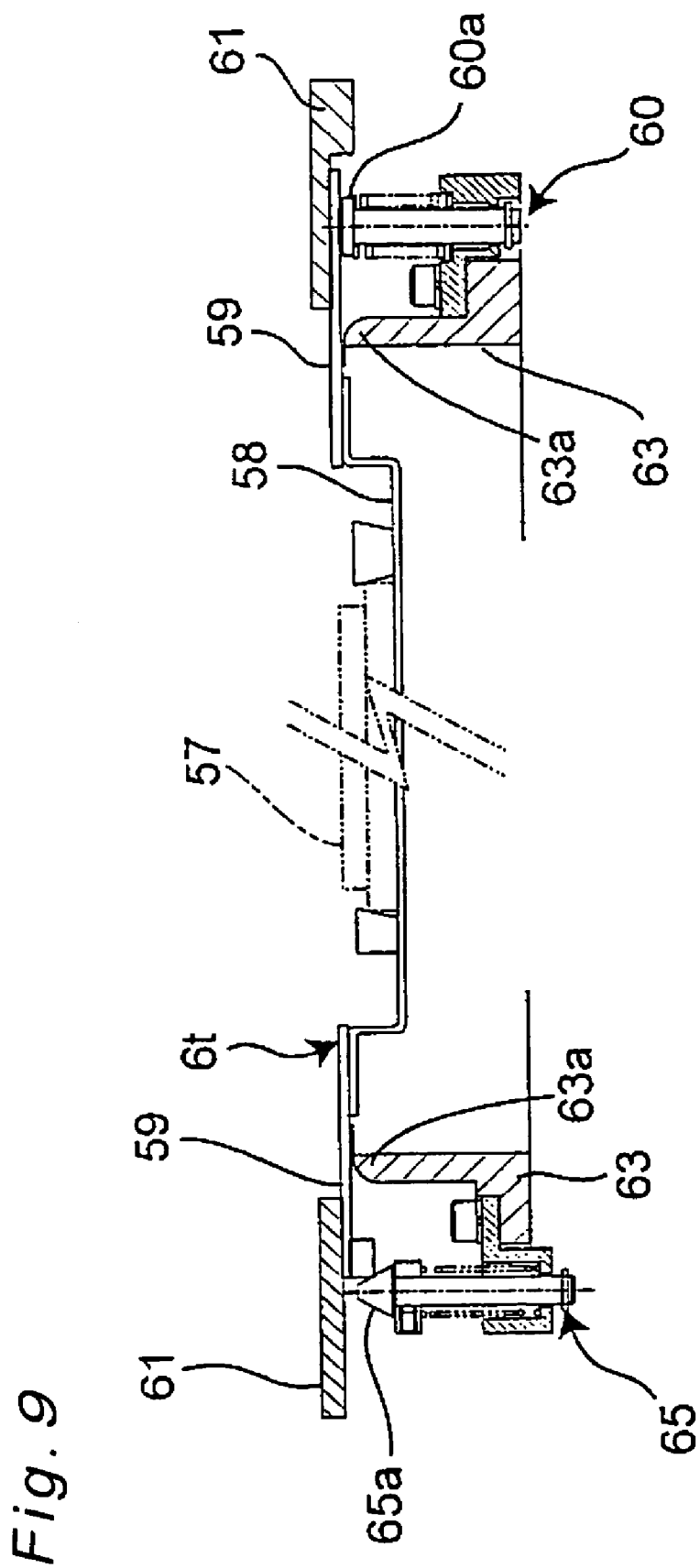
FIG. 9 is a cross sectional view showing the tray feeding plate placed in the plate placement device.

Next, an enlarged cross sectional view of a portion of the thus-structured plate placement device 12 with the wafer feeding plate 6w disposed thereon is shown in FIG. 8, and an enlarged cross sectional view of a portion with the tray feeding plate 6t placed thereon is shown in FIG. 9.

First, as shown in FIG. 8, the ring-shaped expanding member 63 has a flange portion 63b formed on its lower portion toward the outer circumferential direction, and the respective plate support portions 60 and the taper support unit 65 are mounted on the flange portion 63b in a way allowing up and down movement. The plate support portions 60 includes a shaft-like support pin 60b having a support end portion 60a in a flat shape or a mildly raised shape on its upper top end, and a biasing spring 60c disposed on the outer circumference of the support pin 60b so as to constantly bias the support pin 60b upward against the flange portion 63b. It is to be noted that the upper-limit position in biasing the support pin 60b upward by the biasing spring 60c is mechanically limited. Moreover, in FIG. 8, the plate support portions 60 are mounted on the flange portion 63b of the expanding member 63 via a mounting member 66, and lifting and lowering of the support pin 60b can be guided along the inner circumferential face of a pin hole portion 66a formed in the mounting member 66. Therefore, with external force applied downward to the support end portion 60a, the biasing spring 60c is shrunken so that the support pin 60b is lowered along the inner circumferential face of the pin hole portion 66a, whereas with the external force being weakened or released, the shrunken biasing spring 60c is expanded so that the support pin 60b is lifted along the inner circumferential face of the pin hole portion 66a.

Figure 12:
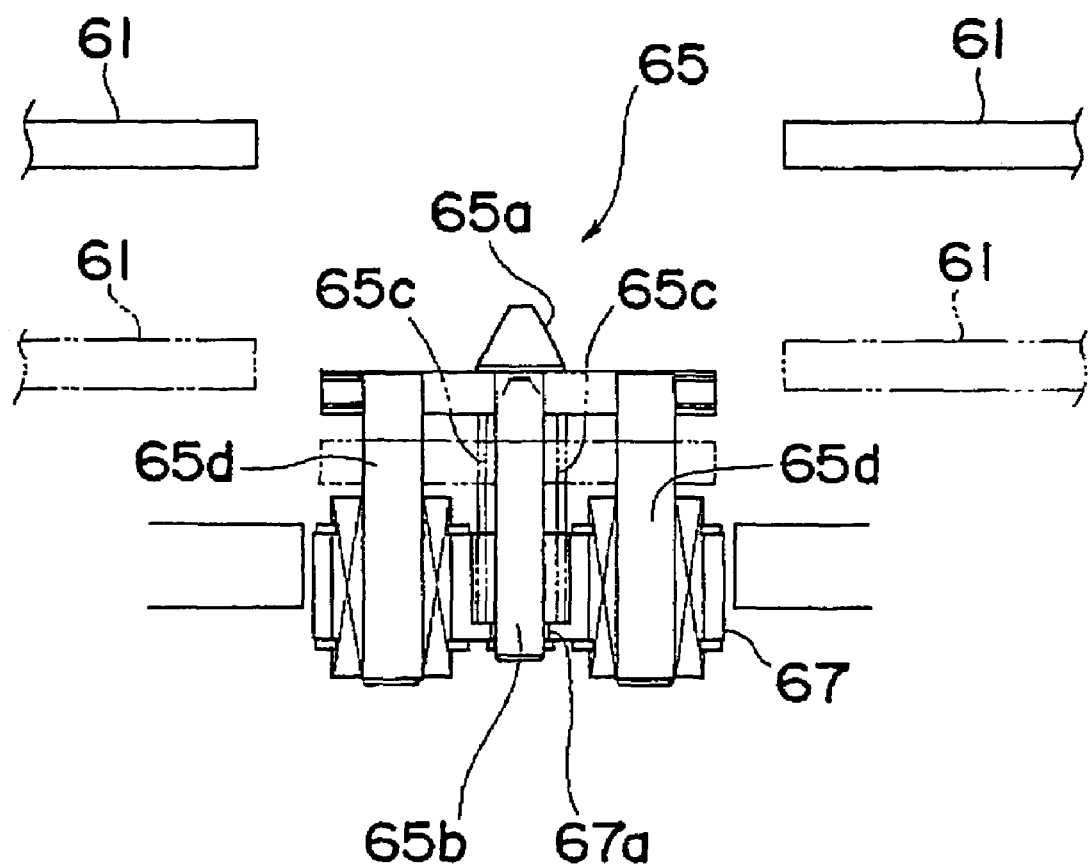
FIG. 12 is an enlarged side view showing a taper support unit.

Moreover, the taper support unit 65, which also has a mechanism based on the same concept as that of the respective plate support portions 60 except the shape of its upper end portion, includes a support pin 65b, a biasing spring 65c, a mounting member 67 and a pin hole portion 67a as shown in FIG. 7, FIG. 8 and FIG. 12. Moreover, the upper end portion forms an inclined end portion 65a in a tapered shape, and bringing the outer circumferential end portion of the wafer ring 9 into contact with the inclined face of the inclined end portion 65a makes it possible to retain the support position of the wafer ring 9 in a direction along the surface of the wafer ring 9 with use of resistance of this angle. It is to be noted that as shown in FIG. 7, FIG. 8 and FIG. 12, the taper support unit 65 has a guide portion 65d for guiding lifting and lowering of the support pin 65b. Moreover, as shown in FIG. 8, the expanding member 63 has a ring-shaped top end portion 63a formed on its upper portion, and the top end portion 63a can come into contact with the lower face of the wafer sheet 8 between the outer peripheral portion of the wafer 7 and the inner peripheral portion of the wafer ring 9.

In such structure, the wafer ring 9 supported in the state of being interposed in between the lower faces of the respective plate presser members 61 and the plate support portions 60 is lowered by the lowering operation of the respective plate presser members 61 by the presser member up/down unit 62, which makes it possible to bring the top end portion 63a of the expanding member 63 into contact with the lower face of the wafer sheet 8 while radially expanding the wafer sheet 8 with the contact position as a supporting point as the wafer ring 9 is lowered. Consequently, the placement positions of the respective wafer feed components 2w attached on the upper face of the wafer sheet 8 are also radially expanded, which makes it possible to achieve so-called expansion of the wafer 7. It is to be noted that as shown in FIG. 7, a plurality of expansion lower-limit stoppers 68, which can regulate the lower-limit position in the lowering of the respective plate presser members 61 by coming into contact with the lower faces of the respective plate presser members 61 when they are lowered, are mounted below the respective plate presser members 61 on the upper face of the placement frame 64, and this regulation of the lower-limit position makes it possible to regulate the expanding range of the wafer sheet 8 in the expansion.

Next, FIG. 9 shows the tray feeding plate 6*t* being disposed on the thus-structured plate placement device 12. As shown in FIG. 9, the tray feeding plate 6*t* is supported in the state the tray ring 59 is interposed in between the respective plate presser members 61 and the support end portions 60*a* of the respective plate support portions 60. Moreover, with the outer circumferential end portion of the tray ring 59 being in contact with the inclined face of the inclined end portion 65*a* of the taper support unit 65, the support position of the tray ring 59 in a direction along its surface is retained with resistance of its angle. Moreover, the tray placement portion 58 positioned in a height position one-step lower than the tray ring 59 is disposed inside the ring-shaped expanding member 63. Further, in the retained state of the tray feeding plate 6*t*, a gap is secured between the top end portion 63*a* of the expanding member 63 and the lower face of the tray ring 59 positioned above the top end portion 63*a* so as to prevent the contact therebetween. This makes it possible to prevent the top end portion 63*a* from being damaged by the contact between the top end portion 63*a* and the tray ring 59. Moreover, such securement of the gap is achieved by regulating the lowering positions of the respective plate presser members 61 by other members. This regulation method will be described with reference to a fragmentary enlarged perspective view of the plate placement device 12 shown in FIG. 10.

Figure 10:
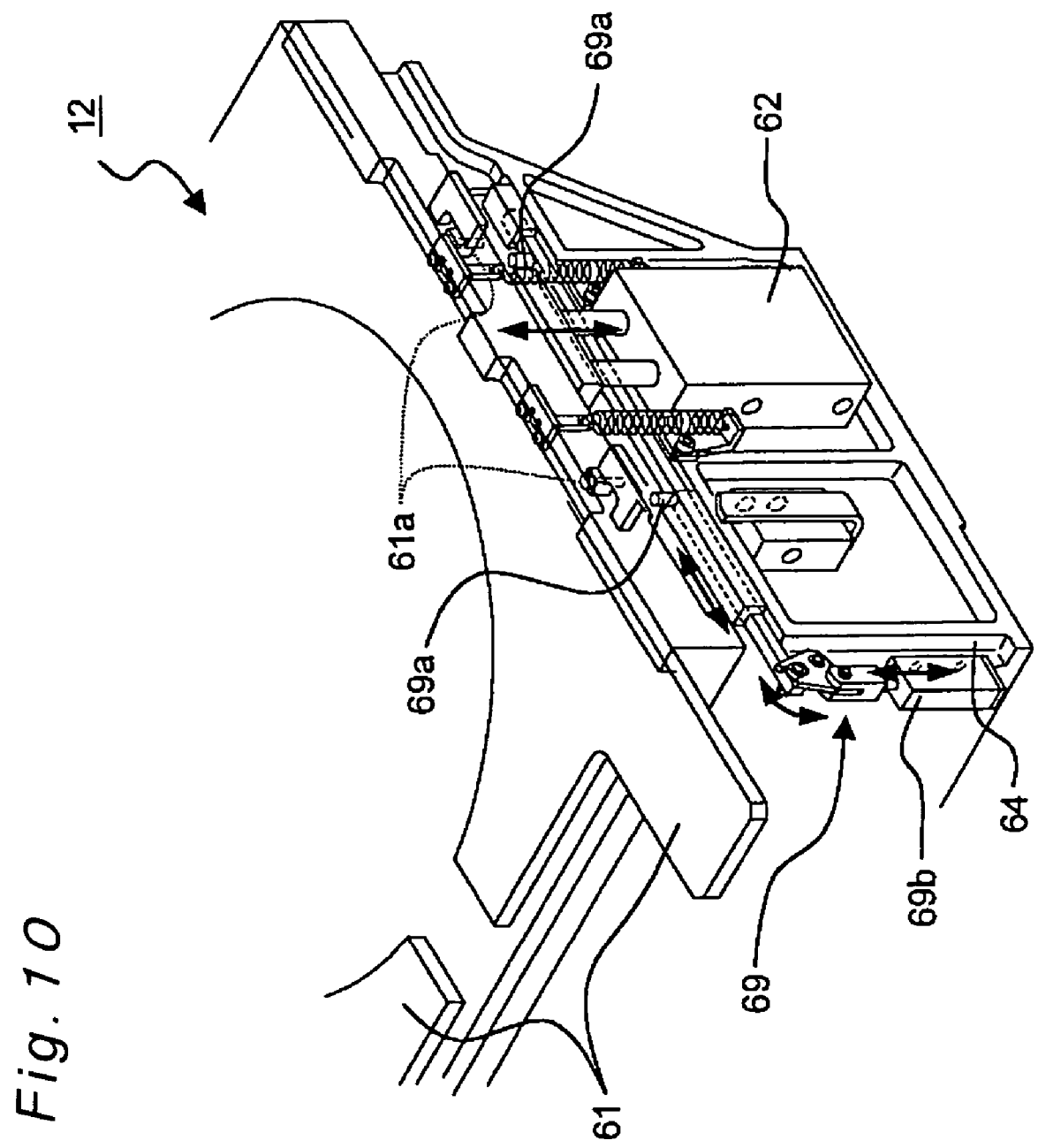
FIG. 10 is a fragmentary enlarged perspective view showing the plate placement device.

As shown in FIG. 10, in the vicinity of an end portion on the front side as viewed in the drawing on the upper face of the placement frame 64 in the plate placement device 12, an intermediate stopper drive unit 69 exemplifying a regulating member for regulating the lowering positions of the respective plate presser members 61 is provided. The intermediate stopper drive unit 69 includes an intermediate stopper 69*a* exemplifying a contact portion disposed in the vicinity of the end portion on the front left-hand side as viewed in the drawing on the upper face of the placement frame 64, and a stopper moving unit 69*b* exemplifying a contact portion moving mechanism for moving the intermediate stopper 69*a* along the end portion. It is to be noted that the stopper moving unit 69*b* is composed of, for example, a cylinder drivable in vertical direction by supplying and discharging compressed air and a link mechanism mounted on the cylinder for mechanically transmitting the cylinder driving to the intermediate stopper 69*a*. Herein, a schematic explanatory view for explaining the operation of the intermediate stopper drive unit 69 will be shown in FIG. 11.

Figure 11:
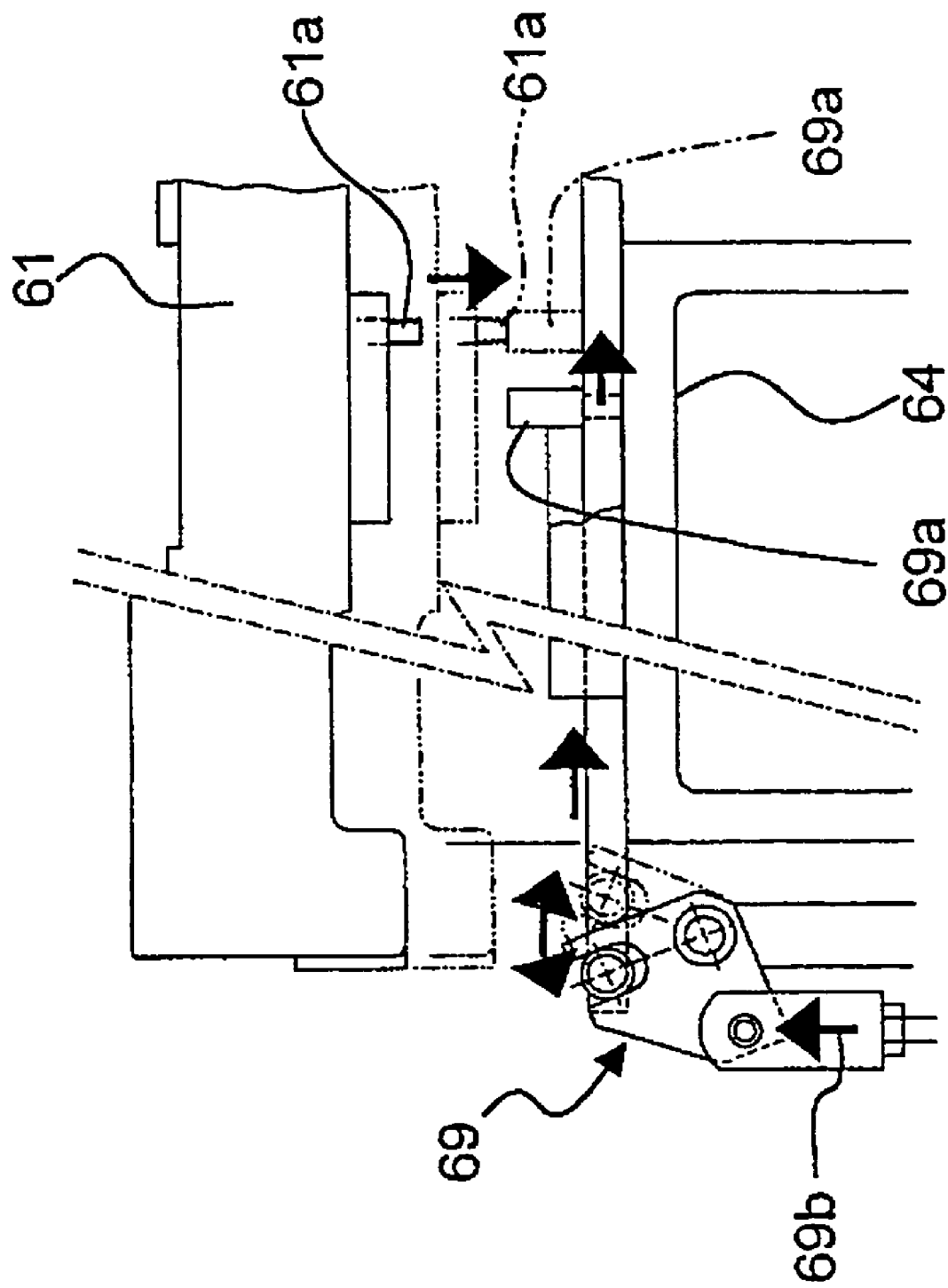
FIG. 11 is a schematic explanatory view showing an intermediate stopper drive unit in the plate placement device.

As shown in FIG. 11, regulation pins 61*a* are provided under the plate presser members 61. The regulation pins 61*a* are so disposed that their lower ends can come into contact with the upper ends of the intermediate stopper 69*a* as the plate presser members 61 are lowered. The stopper moving unit 69*b* can move the intermediate stopper 69*a* forward and backward along the upper face of the placement frame 64 between a contact position which is a position below the regulation pins 61*a* and which enables the intermediate stopper 69*a* to come into contact with the regulation pins 61*a* and a retreat position which enable the intermediate stopper 69*a* to retreat from the contact with the regulation pins 61*a* when the regulation pins 61*a* are lowered. Therefore, it becomes possible to achieve the state of the wafer feeding plate 6*w* shown in FIG. 8 by lowering the respective plate presser members 61 in the state that the intermediate stopper 69*a* is positioned at the retreat position, and it becomes also possible to bring the intermediate stopper 69*a* and the regulation pins 61*a* into contact with each other by lowering the respective plate presser members 61 in the state that the intermediate stopper 69*a* is positioned at the contact position and to regulate the lowering positions of the respective plate presser members 61 so as to achieve the state of the tray feeding plate 6*t* shown in FIG. 9. More particularly, in the state that the intermediate stopper 69*a* and the regulation pins 61*a* are in contact, the gap is secured between the tray ring 59 and the top end portion 63*a* of the expanding member 63 as shown in FIG. 9. It is to be noted that in the plate placement device 12, the intermediate stopper drive units 69 are respectively and separately provided in such a way as to allow regulation of the lower-limit positions in lowering of the respective plate presser members 61, and the respective intermediate stopper drive units 69 are driven in synchronization with each other.

Figure 13:
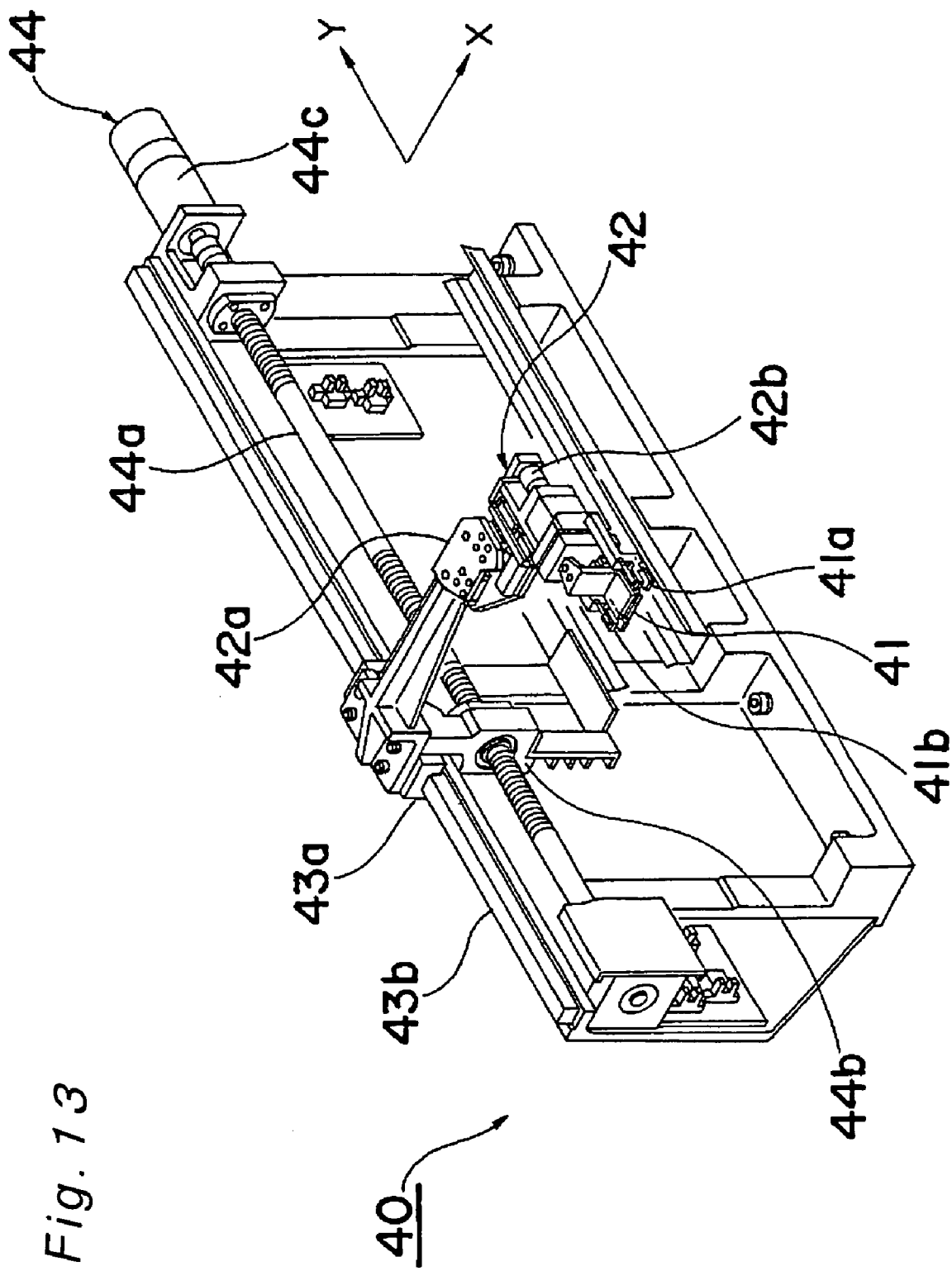
FIG. 13 is a perspective view showing a plate moving device in the component feeder.

Next, a perspective view of the plate moving device 40 is shown in FIG. 13. As shown in FIG. 13, the plate moving device 40 includes a chuck 41 exemplifying a holding part to releasably holding the plate 6, an arm mechanism 42 in an almost planar L shape with the chuck 41 mounted on its top end, and a moving unit 44 exemplifying a holding part moving unit for moving the arm mechanism 42 forward and backward in Y axis direction as viewed in the drawing. The moving unit 44 includes a ball screw shaft 44*a* disposed in Y axis direction as viewed in the drawing, a nut 44*b* engaged with the ball screw shaft 44*a*, and a moving motor 44*c* fixed to one end of the ball screw shaft for rotating the ball screw shaft 44*a* around its shaft core so as to move the nut 44*b* forward and backward in Y axis direction as viewed in the drawing. Moreover, the end portion of the arm mechanism 42 on the side without the chuck is fixed onto an LM block 43*a*, which can guide the movement of the arm mechanism 42 along an LM rail 43*b* disposed in Y axis direction as viewed in the drawing, and the movement of the arm mechanism 42 is achieved by the LM block 43*a* being fixed onto the nut 44*b* and moved together with the nut 44*b*.

Moreover, as shown in FIG. 13, near the chuck 41, a plate distinguishing sensor 41*b* exemplifying a plate distinguishing unit for distinguishing whether the held plate 6 is a wafer feeding plate 6*w* or a tray feeding plate 6*t* based on the shape of an end portion of the plate 6 is mounted on the arm mechanism 42. The plate distinguishing sensor 41*b* distinguishes the plate 6 by recognizing the presence of the identification hole 56 which is not formed on the wafer ring 9 shown in FIG. 4 but is formed on the tray ring 59 shown in FIG. 5 with use of a transparent-type sensor. Moreover, on the opposite side of the plate distinguishing sensor 41*b* across the chuck 41, a plate presence detection sensor 41*a* for detecting whether or not the chuck 41 holds the plate 6 is mounted on the arm mechanism 42. The plate presence detection sensor 41*a* detects the presence of the plate 6 with use of a transparent-type sensor by checking whether or not sensor light is shielded by the end portion of the wafer ring 9 or the tray ring 59. It is to be noted that the movement position of the intermediate stopper 69*a* moved by the intermediate stopper drive unit 69 in the plate placement device 12 is determined based on a recognition result from the plate distinguishing sensor 41*b*.

Moreover, as shown in FIG. 13, the arm mechanism 42 has an X axial centering part 42*a* for, while mechanically leading the chuck 41 to convergence of its swings in the X-axis direction in the figure, automatically performing centering of its position in the X-axis direction. It is to be noted that such a centering mechanism is not limited to centering in X axis direction as viewed in the drawing but may perform centering in Y axis direction as viewed in the drawing. The arm mechanism 42 further has a collision detection sensor 42*b* on the back side in Y axis direction as viewed in the drawing which can detect that the arm mechanism 42 interferes (collides) with other component members. When the collision is detected by the collision detection sensor 42b, the moving unit 44 is stopped from moving so as to prevent failure of the device or damages of the respective electronic components 2 caused by the collision.

(Operation of Component Feeder)

Description is now given of the operation from the step of extracting respective plates 6 from the magazine cassette 50 to the step of extractably disposing the respective electronic components 2 on the plate placement device 12 in the thus-structured component feeder 4.

First, in FIG. 2, the magazine cassette 50 is lifted or lowered by the cassette up/down unit 51 in the lifter device 10 so that a plate 6 to be extracted from the magazine cassette 50 is positioned at a height position of the chuck 41 in the plate moving device 40. At the same time, the respective plate presser members 61 are lifted to a lifting upper-limit position and stopped by the presser member up/down unit 62 in the plate placement device 12.

Next, the arm mechanism 44 is moved by the moving unit 44 in the plate moving device 40 toward the left-hand side in Y axis direction as viewed in the drawing so as to move the chuck 41 into the magazine cassette 50. Then, once a vicinity of the outer circumferential end portion of the plate 6 which is to be extracted from the magazine cassette 50 is detected by the plate presence detection sensor 41a disposed adjacent to the chuck 41, the vicinity of the outer circumferential end portion is held by the chuck 41. At the same time, the plate distinguishing sensor 41b disposed adjacent to the chuck 41 distinguishes whether the held plate 6 is a wafer feeding plate 6w or a tray feeding plate 6t. After that, the moving unit 44 starts to move the arm mechanism 42 toward the right-hand side in Y axis direction as viewed in the drawing, by which the held plate 6 is moved along the respective recess portions 51b on the magazine cassette 50 and extracted.

Then, the plate 6 held by the chuck 41 is moved in such a way as to pass between the respective plate presser members 61 in the plate placement device 12 and the respective plate support portions 60, and is positioned and stopped at the position where the plate 6 can be supported by the respective plate support portions 60. Then, the respective plate presser members 61 is lowered by the presser member up/down unit 62 so as to depress the upper face of the outer peripheral portion of the plate 6 and to bring the lower face of the outer peripheral portion into contact with the upper ends of the plate support portions 60, by which the plate 6 is held in the state of being interposed in between the respective plate presser members 61 and the plate support portions 60. Accordingly, the plate holding state by the chuck 41 is cancelled and the arm mechanism 42 is moved by the moving unit 44 toward the right-hand side in Y axis direction as shown in FIG. 2 and stopped at the position free from planar positional interference between the chuck 41 and the plate 6 is not present. It is to be noted that the height position of the plate 6 in this state is a plate feeding/discharging height position (first height position) which is the height position allowing feeding or discharging of the plate 6 in the state that interference between the top end portion 63a of the expanding member 63 and the plate 6 is reliably prevented.

In the meanwhile, based on the result of identification of the type of the plate 6 by the plate distinguishing sensor 41b, the movement position of the intermediate stopper 69a is determined by the intermediate stopper drive unit 69. First, in the case where the plate 6 is the wafer feeding plate 6w, the intermediate stoppers 69a are moved to the retreat position where the contact between the respective regulation pins 61a and the intermediate stoppers 69a is retreated. Then, the respective plate presser members 61 are further lowered and the respective plate support portions 60 is depressed, so that the wafer sheet 8 is expanded with the top end portion 63a of the expanding member 63 as a supporting point to achieve expansion. It is to be noted that the respective plate presser members 61 come into contact with the respective expansion lower-limit stoppers 68 while being lowered, so that their lower-limit in lowering operation is regulated and in this state, lowering of the respective plate presser members 61 is stopped. In such a state, it becomes possible to extract and feed the respective wafer feed components 2w from the wafer feeding plate 6w, and extraction of the respective wafer feed components 2w is achieved by pushing up the respective wafer feed components 2w from the lower side of the wafer sheet 8 (for example by a component push-up device having a push-up pin) and holding and extracting the pushed-up wafer feed components 2w with the inverting head unit 14. It is to be noted that the height position of the wafer feeding plate 6w in the state that the lowering position is regulated by the respective expansion lower-limit stoppers 68 is an expanding height position (second height position).

In the case were the plate 6 is a tray feeding plate 6t, the intermediate stoppers 69a are moved to the contact position so that the respective regulation pins 61a and the intermediate stoppers 69a can come into contact with each other. After that, the respective plate presser members 61 are further lowered to depress the respective plate support portions 60, and the respective regulation pins 61 and the intermediate stopper 69a come into contact with each other so that the lowering positions of the respective plate presser members 61 are in the state of being regulated. In this state, as shown in FIG. 9, a gap is secured between the lower face of the tray ring 59 and the top end portion 63a of the expanding member 63 so as to prevent the contact therebetween. Moreover, In such a state, lowering of the respective plate presser members 61 is stopped and the respective tray feed components 2t are put in a state extractable from the tray feeding plate 6t. In such a state, the inverting head unit 14 holds and extracts the respective tray feed components 2t from the respective component feeding trays 57 placed on the tray placement portion 58. Moreover, the height position of the tray feeding plate 6t in the state that the lowering positions of the respective plate presser members 61 are regulated by the respective regulation pins 61 and the respective intermediate stoppers 69a is a tray plate holding height position.

Moreover, after the respective electronic components 2 are extracted from the wafer feeding plate 6w or the tray feeding plate 6t as described above, the respective plates 6 are lifted again to the plate feeding/discharging height position and moved to and housed in the magazine cassette 50 by the plate moving device 40 following the above-state procedures backward. It is to be noted that even in the case where only a part of the electronic components 2 is extracted from the respective plates 6, the plates 6 are moved to and housed in the magazine cassette 50 if the target electronic components 2 have been extracted from the plates 6.

(Slack Removal Processing Applied to Wafer Sheet)

Moreover, when the wafer feeding plate 6w is placed on the plate placement device 12, respective wafer feed components 2w are extracted in the expanded state, and then the wafer feeding plate 6w is moved and housed in the magazine cassette 50, a slack removal processing for removing slack generated on the wafer sheet 8 radially expanded by the expanding operation is performed in the plate placement device 12.

The device structure and the processing procedures for performing the slack removal processing in such a plate placement device 12 will be described with reference to schematic explanatory views of the plate placement device 12 shown in FIG. 14 to FIG. 17 and a flowchart showing the steps of the slack removal processing shown in FIG. 18.

Figure 14:
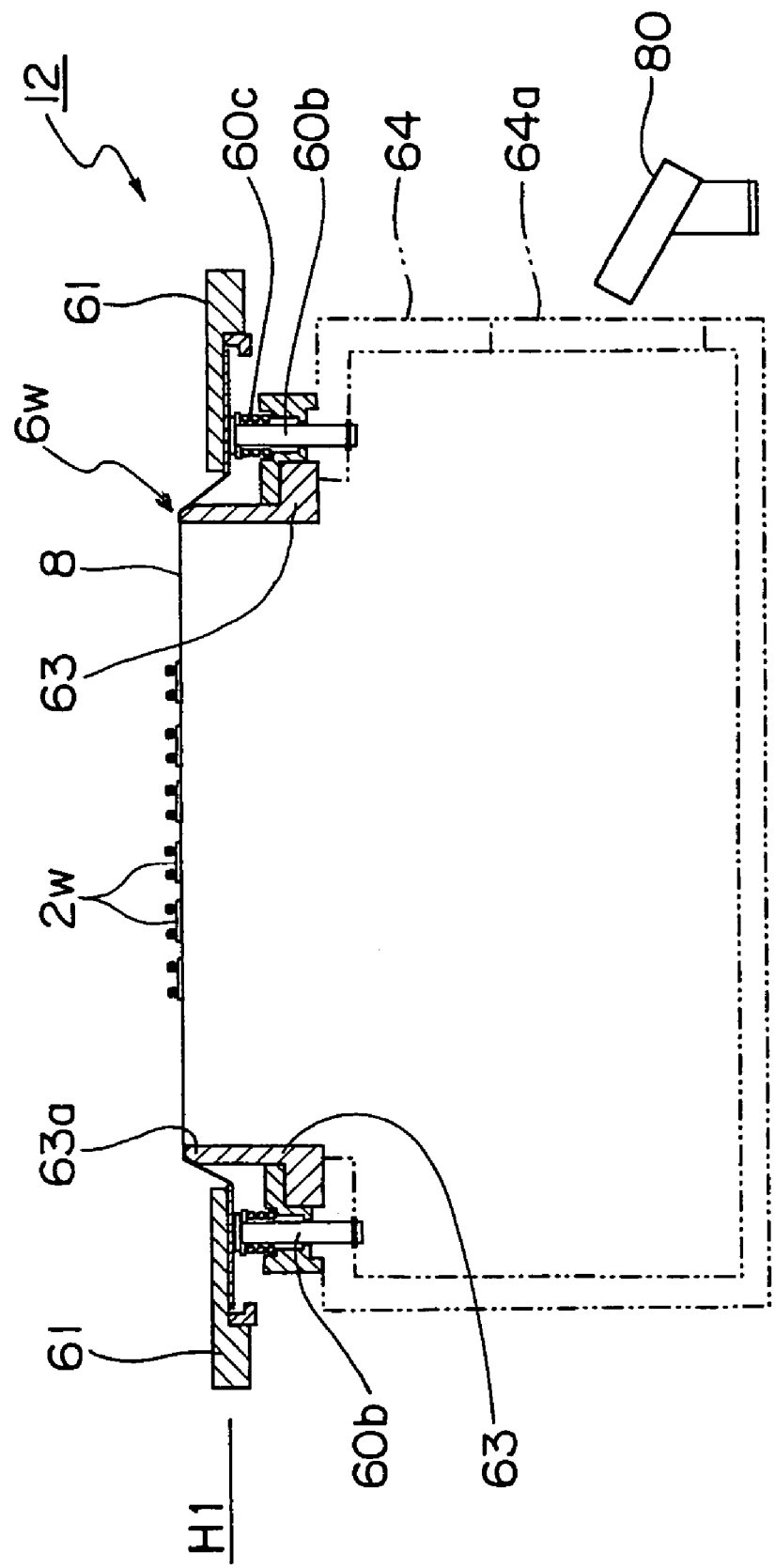
FIG. 14 is a schematic explanatory view showing the wafer feeding plate positioned at an expanding height position in the plate placement device.

As shown in FIG. 14, the plate placement device 12 has a heating blower device 80 for blowing heated air to the lower face of the wafer sheet 8 with slack and shrinking the wafer sheet 8 to remove the slack as the slack removal processing.

As shown in FIG. 14, the heating blower device 80, which is disposed outside an almost box-shaped placement frame 64 disposed below the plate placement device 12, can blow heated air to the lower face of the wafer sheet 8 through a hole portion 64a of the placement frame 64. Thus, the heating blower device 80 is so disposed as to avoid the lower portion of the wafer feeding plate 6w held by the plate presser members 61, which is to prevent interference between a push-up device (unshown) movably disposed in a space inside the placement frame 64 for pushing up respective wafer feed components 2w attached onto the wafer sheet 8 and the heating blower device 80.

Moreover, the heating blower device 80 is structured such that supplied compressed air can be heated by a heating means such as heaters and the heated compressed air can be blown toward the oblique upper side so as to be blown to the lower face of the wafer sheet 8. It is to be noted that it is made possible to control heating temperature of the compressed air, and blowing the compressed air heated to about 100° C. to the wafer sheet 8 makes it possible to heat the surface temperature of the wafer sheet 8 to about 60° C.

The procedures of the slack removal processing with use of such a heating blower device 80 will be described with reference to the drawings.

First, as shown in FIG. 14, the wafer feeding plate 6w is positioned at an expanding height position (second height position) H1 to achieve expansion in the plate placement device 12. With this expansion, the wafer sheet 8 is stretched almost radially. Moreover, in this expanded state, the respective wafer feed components 2w are extracted from the wafer sheet 8.

Figure 18:
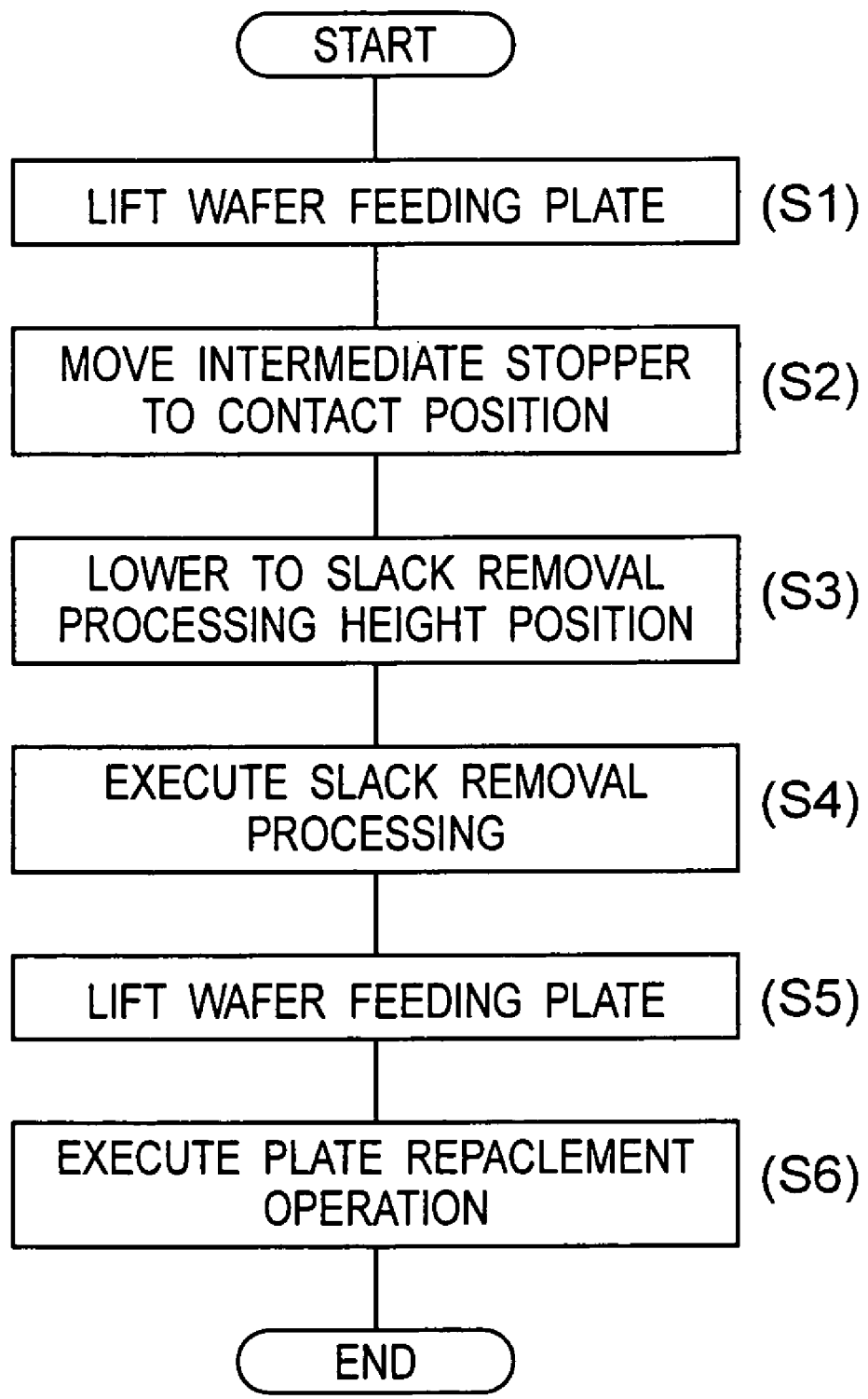
FIG. 18 is a flowchart showing the procedures of performing the slack removal processing after applying expansion to the wafer feeding plate.

When extraction of the respective wafer feed components 2w is completed, the respective plate presser members 61 positioning the wafer feeding plate 6w at the expanding height position H1 are lifted by the presser member up/down unit 62, and the wafer feeding plate 6w is lifted by biasing force of the biasing spring 60c in the respective support pin 60b (see step S1 in FIG. 18).

Figure 15:
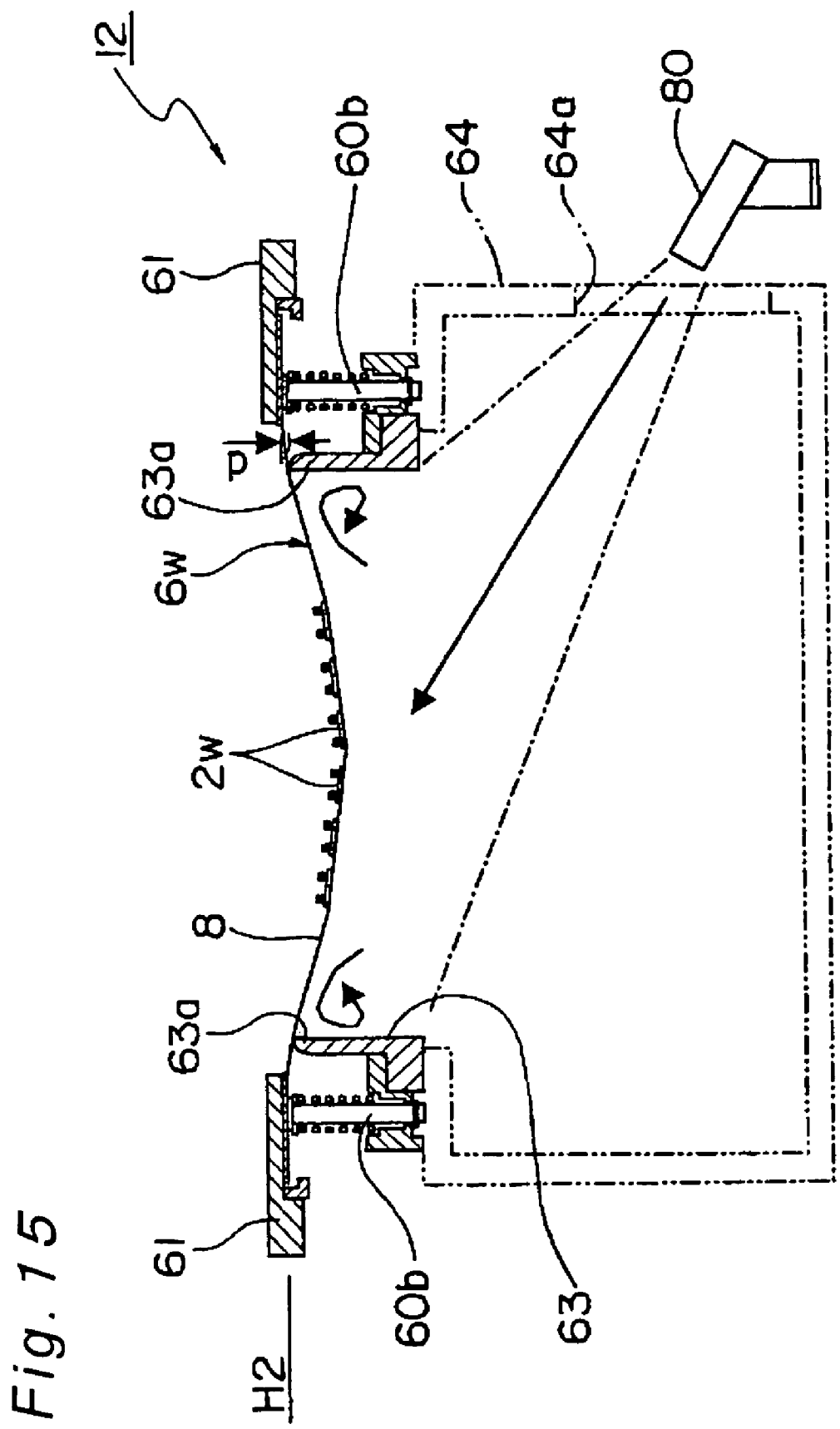
FIG. 15 is a schematic explanatory view showing the wafer feeding plate positioned at a height position for slack removal processing in the plate placement device immediately after the start of the slack removal processing.

When the wafer feeding plate 6w is positioned above a tray plate holding height position, the intermediate stoppers 69a of the intermediate stopper drive unit 69 are moved from the retreat position to the contact position as shown in FIG. 11 (step S2 in FIG. 18). After this movement, the wafer feeding plate 6w positioned above is lowered so that the regulation pins 61a and the intermediate stoppers 69a are brought into contact with each other. Consequently, as shown in FIG. 15, the wafer feeding plate 6w is held at the tray plate holding height position (step S3 in FIG. 18). It is to be noted that instead of moving the intermediate stoppers 69a after the wafer feeding plate 6w is positioned above the tray plate holding height position, the intermediate stoppers 69a may be moved to regulate the height position of the wafer feeding plate 6w when the wafer feeding plate 6w is positioned at the tray plate holding height position.

It is to be noted that the tray plate holding height position is equal to a slack removal processing height position (third height position) H2 for removing slack generated on the wafer sheet 8. As shown in FIG. 15, the wafer feeding plate 6w positioned at the slack removal processing height position H2 has a small gap d that is large enough to prevent the contact between the top end portion 63a of the expanding member 63 and the lower face of the wafer sheet 8 which is almost free from slack. Such a gap d should preferably be set in the range of, for example, about 0.2 mm to 1.5 mm, and in this embodiment, it is set at 0.2 mm. It is to be noted that in the wafer feeding plate 6w shown in FIG. 15, the wafer sheet 8 has slack, and therefore regardless of the presence of the gap d, the lower face of the wafer sheet 8 and the top end portion 63a of the expanding member 63 are in contact with each other.

Thus, in the state that the wafer feeding plate 6w is positioned at the slack removal processing height position H2, application of heating blow by the heating blower device 80 is performed (step S4 in FIG. 18). As shown in FIG. 15, heated air blown from the heating blower device 80 is supplied to the space almost enclosed with the lower face of the wafer sheet 8 and an almost ring-shaped expanding member 63 and is blown to the lower face of the wafer sheet 8. Moreover, at the slack removal processing height position H2, the gap d is secured as described above between the top end portion 63a of the expanding member 63 and the lower face of the wafer sheet 8 (in FIG. 15, both the portions are in contact due to the presence of slack), so that the heated air supplied to the space is less likely to leak to the outside of the expanding member 63. This allows efficient and almost uniform heating of the wafer sheet 8 by heating blow.

Figure 16:
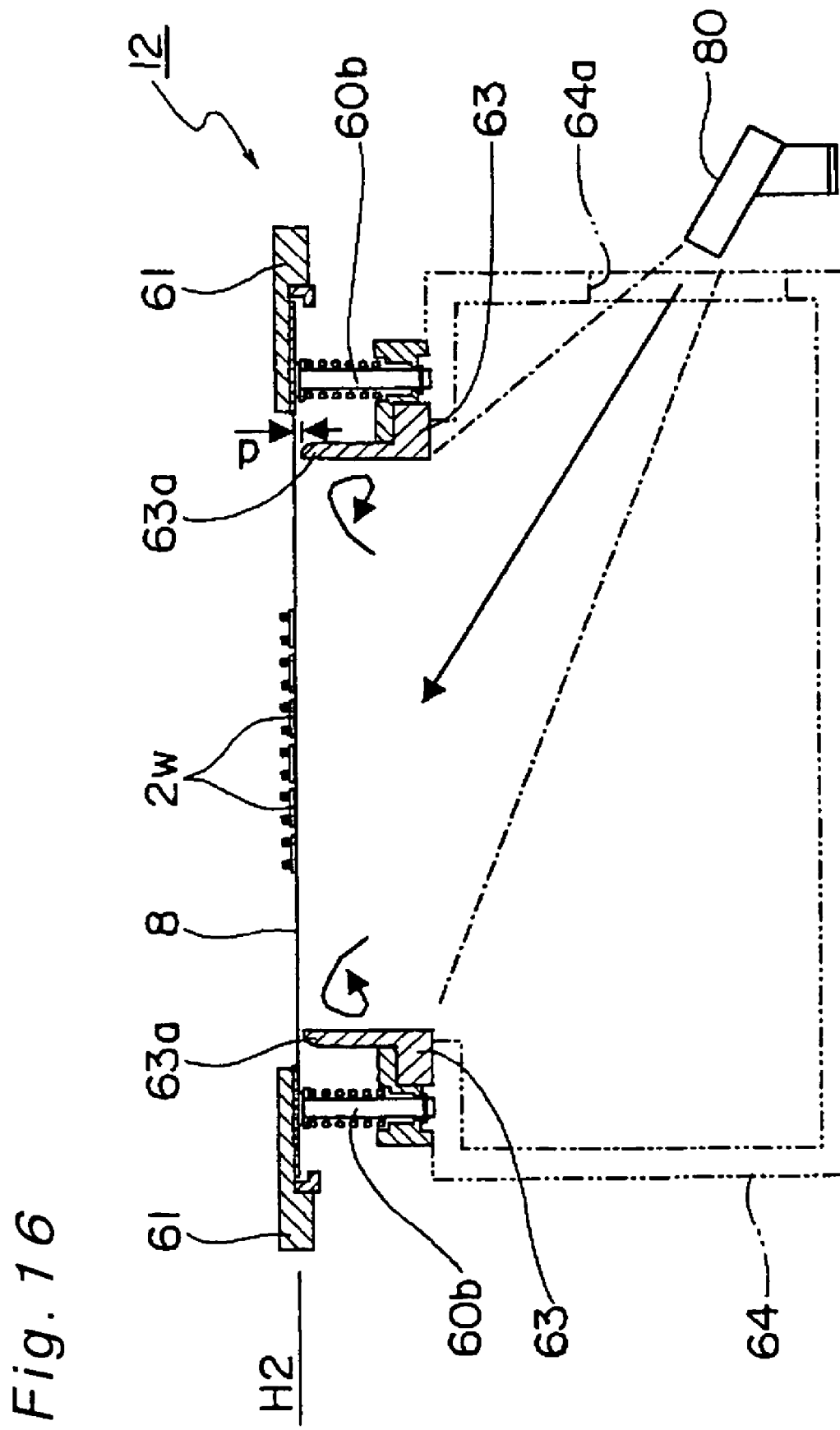
FIG. 16 is a schematic explanatory view showing the wafer feeding plate positioned at the height position for slack removal processing in the plate placement device immediately before the end of the slack removal processing.

FIG. 16 shows the state that the slack of the wafer sheet 8 is mostly removed by the heating blow. As shown in FIG. 16, the wafer sheet 8 with the slack is shrunken by heating with the heating blow, by which the slack is mostly removed and the wafer sheet 8 is kept almost horizontal. Moreover, in the state that the slack is mostly removed, the lower face of the wafer sheet 8 and the top end portion 63a of the expanding member 63 are away from each other only by the gap d, which keeps the state that the heated air supplied to the space is less likely to leak to the outside of the expanding member 63 through the gap d.

Moreover, in the final stage in removal of the slack on the wafer sheet 8 by the heating blow, i.e., shrinkage by heating, the wafer sheet 8 and the top end portion 63a of the expanding member 63 are away from each other without any contact, which prevents the shrinkage of the wafer sheet 8 from being disturbed by the contact and makes it possible to implement shrinkage of the wafer sheet 8 in an almost uniform state without causing uneven shrinkage.

Therefore, the gap d secured at least when the slack removal processing is completed can suppress generation of the uneven shrinkage, and the gap d should preferably be the size less likely to leak the heated air from the space. It is preferable to determine the gap d (for example in the range of about 0.2 mm to 1.5 mm) in view of these points.

Figure 17:
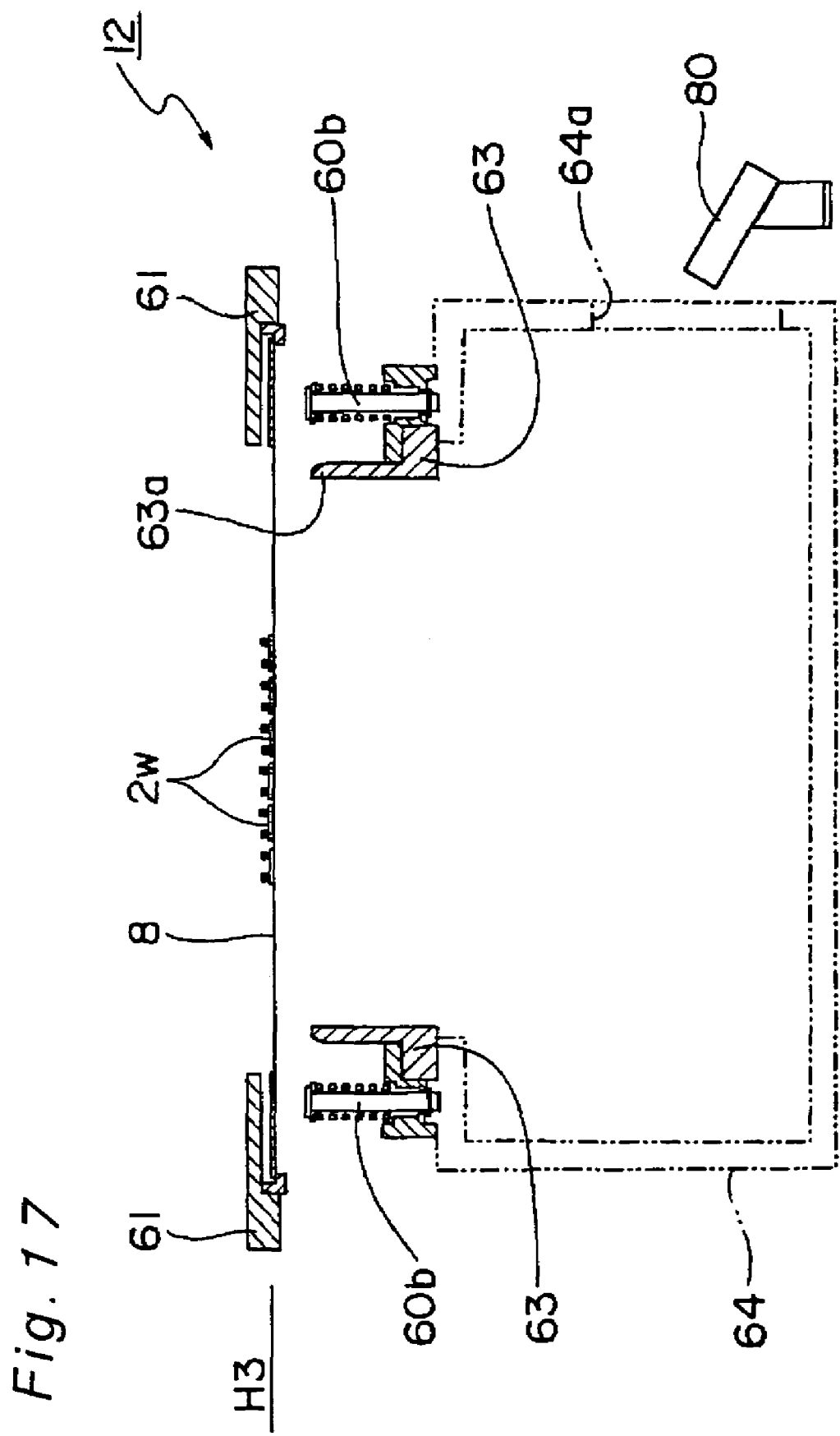
FIG. 17 is a schematic explanatory view showing the wafer feeding plate positioned at a height position for plate feeding/discharging in the plate placement device.

Once the slack on the wafer sheet 8 is mostly removed, the heating blow by the heating blower device 80 is stopped and the slack removal processing is completed. After that, the respective plate presser members are lifted by the presser member up/down unit 62, and the wafer feeding plate 6w is positioned at a plate feeding/discharging height position H3 as shown in FIG. 17 (step S5 in FIG. 18). Then, the wafer feeding plate 6w is moved to and housed in the magazine cassette 50 by the plate moving device 40. Then, according to the need, another plate 6 housed in the magazine cassette 50 is extracted by the plate moving device 40 and moved to the plate placement device 12 for replacement of the plate 6 (step S6 in FIG. 18). With this, a series of operations from execution of the slack removal processing to the replacement of the plate 6 are completed.

Description is now given of a modified example of the expanding member having an almost ring shape included in the plate placement device 12. A schematic structure view of a plate placement device 112 having an expanding member 163 according to such a modified example is shown in FIG. 19.

Figure 19:
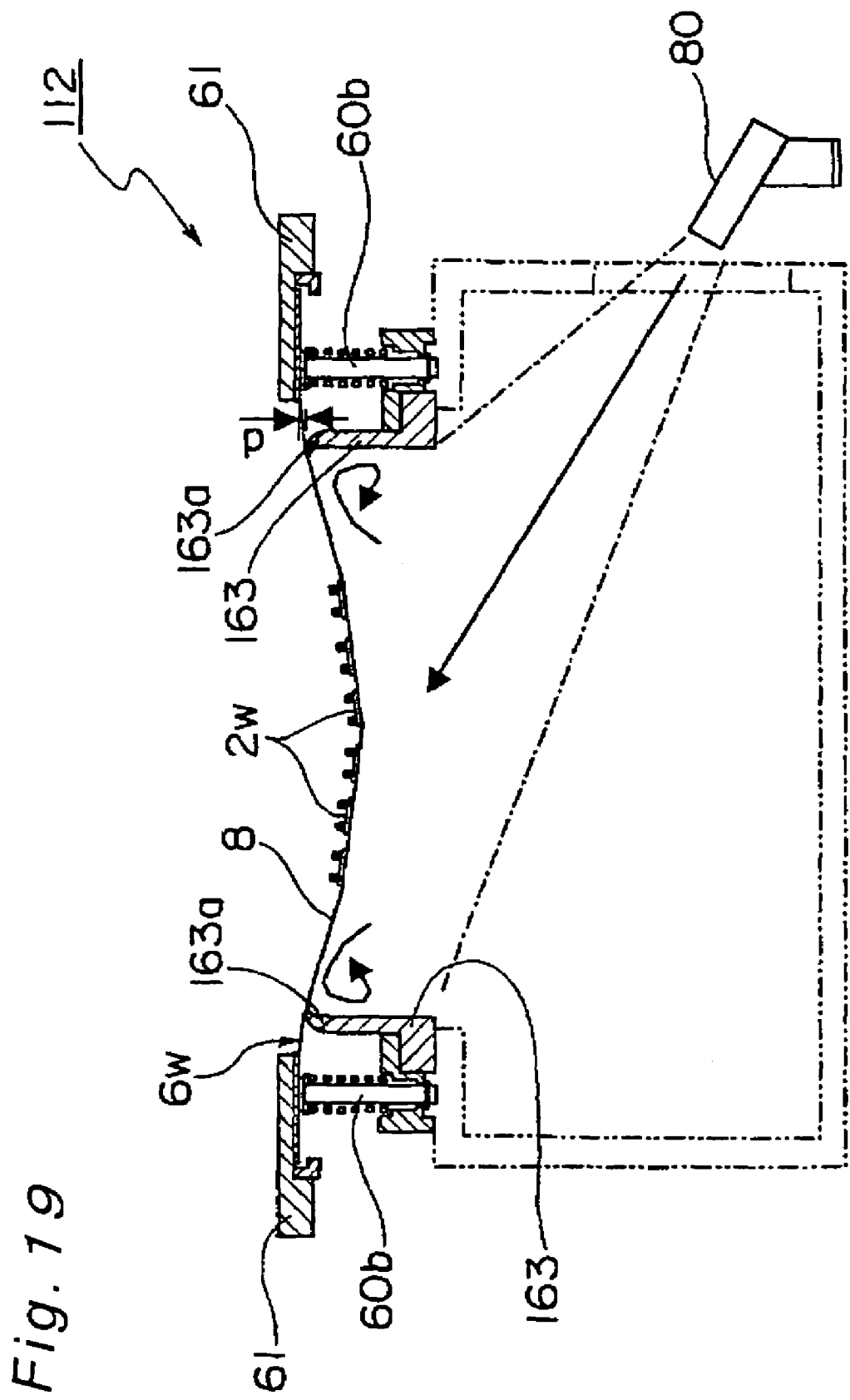
FIG. 19 is a flowchart showing the slack removal processing performed with use of an expanding member according to a modified example of the first embodiment.

As shown in FIG. 19, the expanding member 163 is formed into a ring shape almost identical to the expanding member 63, though the shape of its ring-shaped top end portion 163a is different. Herein, a fragmentary enlarged cross sectional view of the expanding member 163 is shown in FIG. 20.

Figure 20:
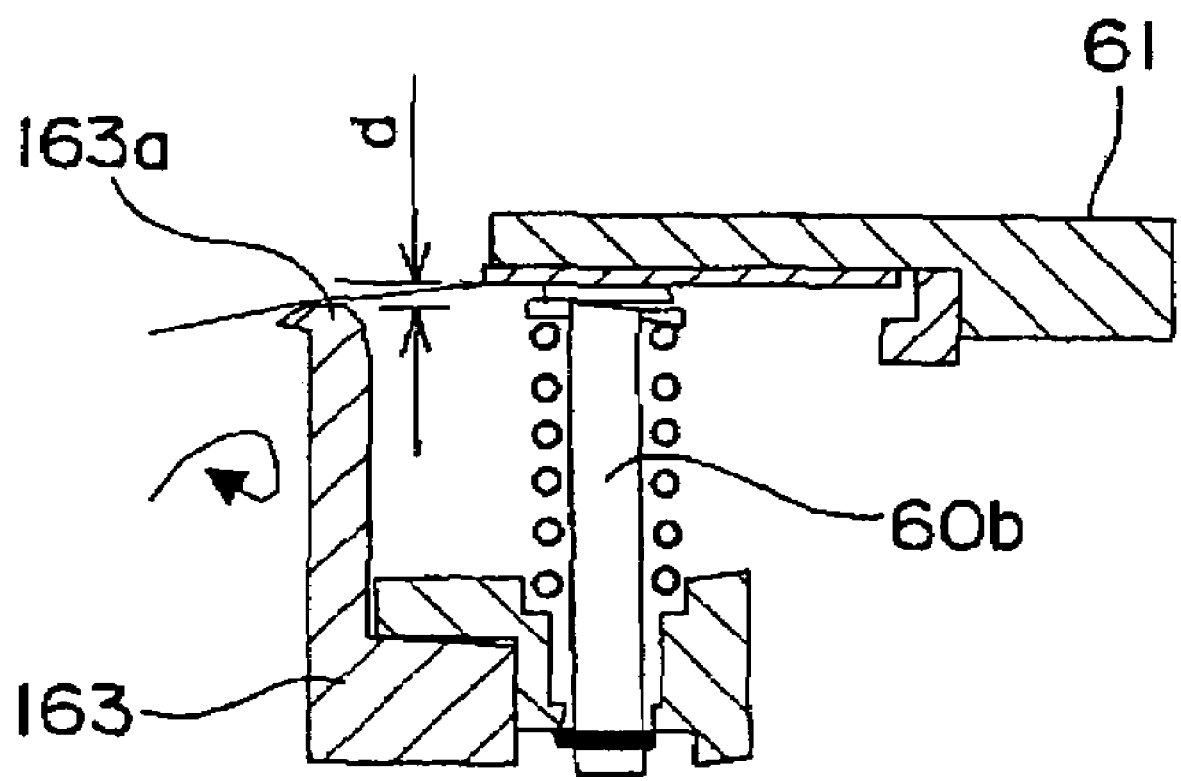
FIG. 20 is a fragmentary enlarged view showing the expanding member in FIG. 19.

As shown in FIG. 20, the top end portion 163a of the expanding member 163 has a shape bent toward the inside of its ring shape. However, even with the top end portion 163a formed in the state of being bent, the top end portion 163a is formed to have the height size similar to that of the expanding member 63, i.e., formed to secure a specified gap d between the top end portion 163a and a wafer sheet 8 on the wafer feeding plate 6w positioned at the slack removal processing height position H2.

Thus, forming the top end portion 163a of the expanding member 163 so as to be bent inside makes it possible to achieve an effect of further reducing an amount of heated air which is blown from the heating blower device 80 during execution of the slack removal processing and leaked from the gap d between the top end portion 163a of the expanding member 163 and the wafer sheet 8 as shown in FIG. 19.

Figure 21:
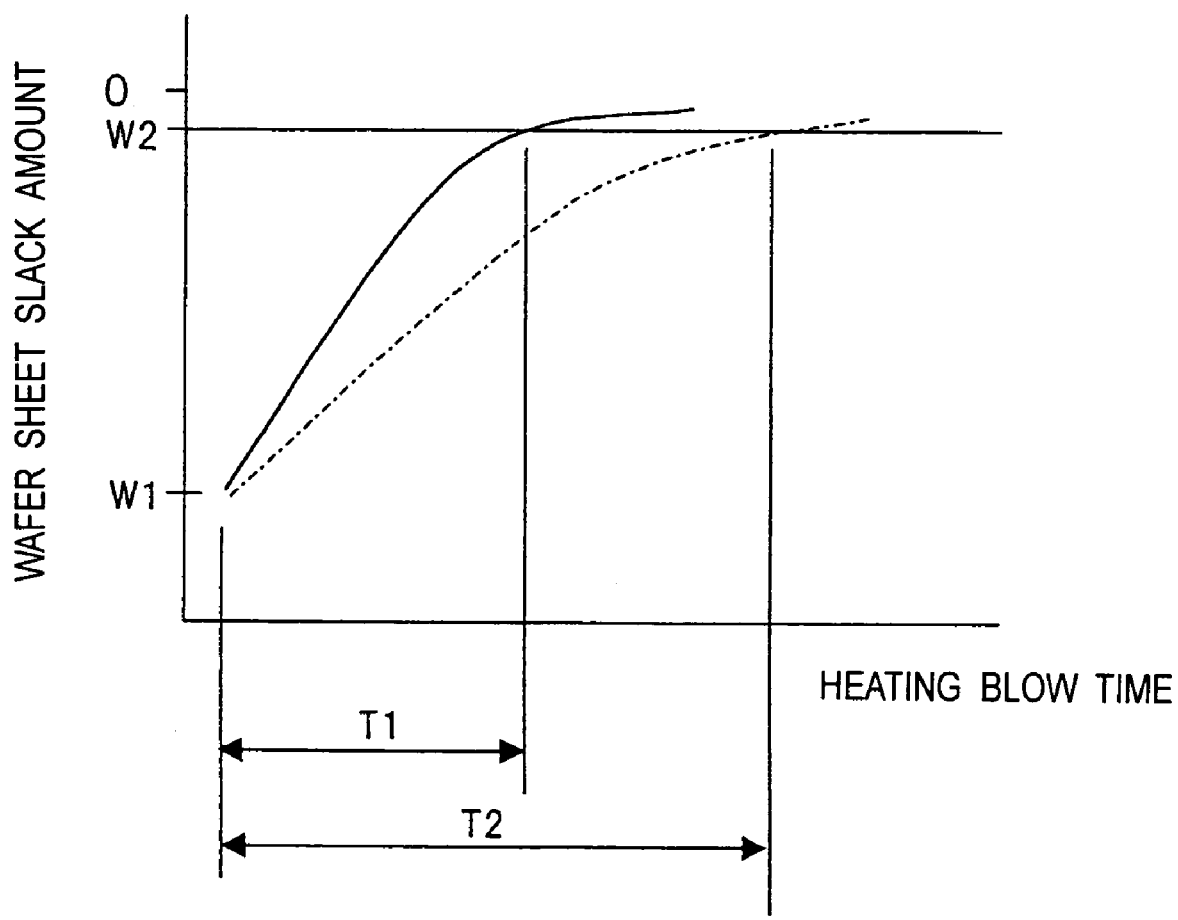
FIG. 21 is a graph view showing the relation between a slack amount of the wafer sheet and a time taken for the slack removal processing for comparison between the slack removal processing in the first embodiment and a conventional processing.

Herein, regarding a time taken for completing slack removal processing performed on the wafer sheet 8 with slack due to the expanding operation, a comparison between the conventional method involving no slack removal processing height position and the method in the first embodiment in which the processing is performed at the slack removal processing height position H2 is shown in FIG. 21 as a graph view. It is to be noted that in FIG. 21, a vertical axis represents a slack amount remaining in the wafer sheet 8 whereas a horizontal axis represents a time taken for the slack removal processing. It is to be noted that in the horizontal axis that is a time axis in FIG. 21, time progresses rightward as viewed in the drawing, while in the vertical axis showing a slack amount, the amount becomes larger downward. Moreover, in FIG. 21, W1 denotes a slack amount of the wafer sheet 8 generated by application of the expanding operation, and W2 denotes an allowable slack amount remaining in the wafer sheet 8 after application of the slack removal processing. Moreover, a heating blow time necessary for reducing the slack amount from W1 to W2 through application of heating blow to the wafer sheet 8 is expressed as T2 in the conventional method and as T1 in the method in the first embodiment.

As shown in FIG. 21, it is clear that the time T1 necessary for executing the slack removal processing in the first embodiment can evidently be made shorter than the time T2 necessary for executing the slack removal processing in the conventional method. More particularly, during the slack removal processing in the first embodiment, the wafer feeding plate 6w is positioned at the slack removal processing height position H2 set between the plate feeding/discharging height position H3 and the expanding height position H1, and the lower face of the wafer sheet 8 and the top end portion 63a of the expanding member 63 are away from each other only by the gap d which is so set to make it difficult for heated air to leak, which allows efficient and almost uniform heating of the wafer sheet 8 with use of the heated air supplied by the heating blower device 80. Therefore, it becomes possible to shorten the time necessary for the slack removal processing and to implement efficient component feeding. For example, the time taken for the conventional slack removal processing can be shortened for about 30 to 50%. It is to be noted that the time T1 is, for example, a period of time of about 5 to 15 seconds.

Although in the first embodiment, description has been given of the case where the wafer feeding plates 6w and the tray feeding plates 6t which are different in type are housed in the magazine cassette 50 in a consolidated state, and a wafer feeding plate 6w or a tray feeding plate 6t is selectively extracted from the magazine cassette 50 and disposed on the plate placement device 12 for feeding the electronic components 2 according to the type of the plate 6, the present invention is not limited to such a case. Instead of this case, for example, only the wafer feeding plates 6w may be housed in the magazine cassette 50, and only the wafer feeding plates 6w may be disposed on and fed to the plate placement device 12. In such a case, the plate placement device 12 functions as a wafer expanding device for expanding the wafer feeding plates 6w and also as a wafer supply component feeder for feeding wafer feed components 2w with use of the expanded wafer feeding plates 6w.

According to the first embodiment, various effects as shown below may be obtained.

First, when the expanding operation is applied to the wafer feeding plate 6w in the plate placement device 12, and then the slack removal processing is performed by the heating blower device 80 to remove the slack on the wafer sheet 8 generated by the expansion, the wafer feeding plate 6 is positioned at the slack removal processing height position H2 between the plate feeding/discharging height position H3 and the expanding height position H1, so that a distance between the lower face of the wafer sheet 8 and the top end portion 63a of the expanding member 63 can be made not more than the gap d. Moreover, the gap d is so set that heated air supplied to a space enclosed with the wafer sheet 8 and the expanding member 63 is less likely to leak to the outside of the expanding member 63 through the gap d, which makes it possible to effectively transmit an amount of heat held by the heated air to the wafer sheet 8. Therefore, it becomes possible to shorten the time necessary for the slack removal processing as well as to reduce uneven heating of the wafer sheet 8 to reduce uneven shrinkage caused by the heating, thereby allowing almost uniform removal of the slack.

Moreover, since such a wafer sheet 8 comes into contact with the top end portion 63a of the expanding member 63 and undergoes expansion with the top end portion 63a as a supporting point, the wafer sheet 8 has such a characteristic that its stretched amount becomes larger in the vicinity of the top end portion 63a. Since an amount of heated air leaking from the gap d is reduced in the vicinity of the area with a large stretched amount, more effective heating is achieved.

Moreover, in the plate placement device 12, a gap is secured between the lower face of the wafer sheet 8 mostly free from slack and the top end portion 63a of the expanding member 63 so as to avoid their contact (butting) at least when the slack removal processing is completed, so that the slack removal processing height position H2 can reliably prevent shrinkage of the wafer sheet 8 from being disturbed by their contact resistance, thereby allowing implementation of almost uniform slack removal. Herein the state that "their contact (butting) is avoided" includes not only the case in which the contact between the lower face of the wafer sheet 8 and the top end portion 63a of the expanding member 63 is completely avoided but also the case in which the lower face of the wafer sheet 8 and the top end portion 63a of the expanding member 63 are slightly in contact though the contact state is in a level which does not disturb shrinkage of the wafer sheet 8 (i.e., the level which do not obstruct the shrinkage) by its contact resistance.

Moreover, in the plate placement device 12, by setting the slack removal processing height position H2 and the tray plate holding height position to be the same height position, it becomes possible to integrate a mechanism to stop the plates 6 at the respective height positions, which allows simplification of the device composition.

Moreover, since the lowering positions of the respective plate presser members 61 in the plate placement device 12 of the component feeder 4 can selectively be regulated by the intermediate stopper drive unit 69, regulating the lowering position according to the type of the plate 6 disposed on the plate placement device 12 makes it possible to reliably hold the tray feeding plate 6t, whereas canceling the regulation of the lowering position makes it possible to stretch the wafer sheet 8 while reliably holding the wafer feeding plate 6w for achieve the expansion. Therefore, it is possible to selectively and automatically perform appropriate holding operation and expanding operation according to the type of the disposed and fed plate 6, thereby allowing efficient component feeding.

Moreover, distinguishing the type of the plate 6 may be achieved with use of the plate distinguishing sensor 41b provided adjacent to the chuck 41 which grasps the end portion of the plates 6 when extracting the respective plates 6 housed in the magazine cassette 50 in a consolidated state. More specifically, the type of the plate 6 can be distinguished by imparting the identification hole 56 to the end portion of the plate 6 only in the case of the tray feeding plate 6t and recognizing the presence of the identification hole 56 with the plate distinguishing sensor 41b. Moreover, determining the movement position of the intermediate stoppers 69a moved by the intermediate stopper drive unit 69 based on the identification result allows selective regulation of the lowering positions of the respective plate presser members 61.

Moreover, since the lowering positions of the respective plate presser members 61 are regulated so as not to bring the top end portion 63a of the expanding member 63 which performs expansion upon coming into contact with the wafer sheet 8 on the wafer feeding plate 6w into contact with the lower face of the tray feeding plate 6t, it becomes possible to prevent damaging the top end portion of the expanding member 63.

Moreover, the plate placement device 12 has a plurality of the plate support portions 60 whose support height positions are variable, which makes it possible to support the respective plates 6 in the vicinity of the outer peripheral portion of the respective plates 6 and to freely change the support height positions while doing the supporting in conformity with the up/down operation of the respective plate presser members 61, thereby allowing fulfillment of the above effects.

Moreover, the presence of the taper support unit 65 having the inclined end portion 65a on its top end makes it possible to bring the end portion of the plate 6 into contact with the inclined end portion 65a and to retain the support position of the plate 6 in a direction along its surface with an angular resistance thereof, thereby achieving reliable and accurate holding.

Second Embodiment

It is to be noted that the present invention is not limited to the embodiment disclosed, and may be embodied in various forms. For example, a component feeder according to a second embodiment of the present invention is different from the component feeder 4 in the first embodiment in the point that two types of plates 6 are handled as wafer feeding plates, and other structures are identical to those in the first embodiment. Therefore, only the different structures will be described with reference to the drawings.

In the second embodiment, the component feeder 4 in the first embodiment is used as it is. In a magazine cassette 50 included in the component feeder 4, wafer feeding plates 6w for feeding wafer feed components 2w and tray feeding plates 6t for feeding tray feed components 2t are housed in a consolidated state, and further, expanded wafer feeding plates 6f which have an expanded wafer holding ring placed on its upper face which is for holding a relatively small-size wafer composed of wafer feed components such as LEDs in an expanded state are housed therein. It is to be noted that the expanded wafer feeding plate 6f feedably holds diced wafer feed components and therefore it can be said that the expanded wafer feeding plate 6f also exemplifies a wafer feeding plate.

Figure 22:
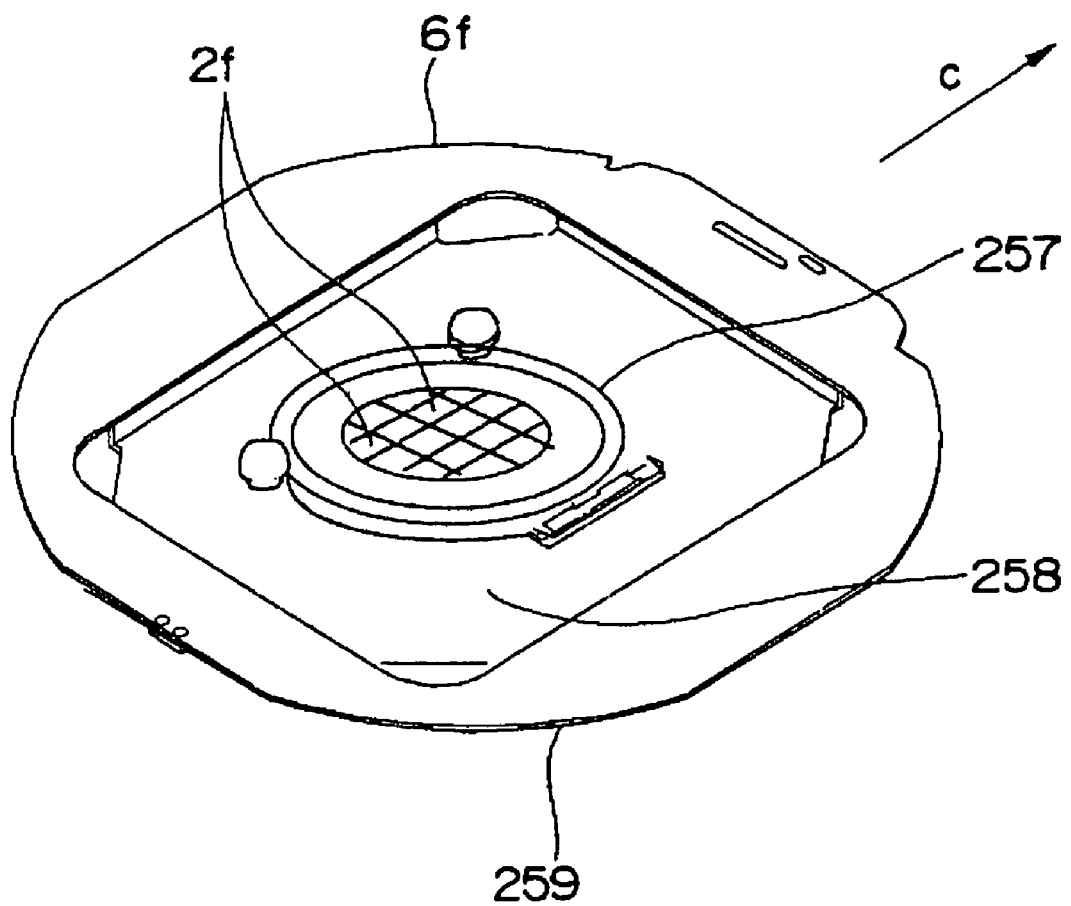
FIG. 22 is a schematic perspective view showing an expanded wafer feeding plate handled in a component feeder according to a second embodiment of the present invention.

Herein, a schematic perspective view showing the schematic structure of the expanded wafer feeding plate 6f is shown in FIG. 22. As shown in FIG. 22, the expanded wafer feeding plate 6f has an almost disc-like shape having an outer peripheral portion composed of a linear portion and a curved portion, and has a shape combining the wafer feeding plate 6w and the tray feeding plate 6t described in the first embodiment. More particularly, respective end portions of the expanded wafer feeding plate 6f facing each other with the plate extraction direction C interposed therebetween can engage with respective recess portions 50b on the magazine cassette 50, and such a shape of the expanded wafer feeding plate 6f makes it possible to retrievably house the expanded wafer feeding plates 6f together with the wafer feeding plates 6w and the tray feeding plates 6t in the common magazine cassette 50. It is to be noted that the wafer on the expanded wafer holding ring placed on such an expanded wafer feeding plate 6f is a relatively smalls-size wafer, i.e., a wafer in a size of not more than 6 inches such as 2-inch wafers, 3-inch wafers and 4-inch wafers is placed.

Figure 23:
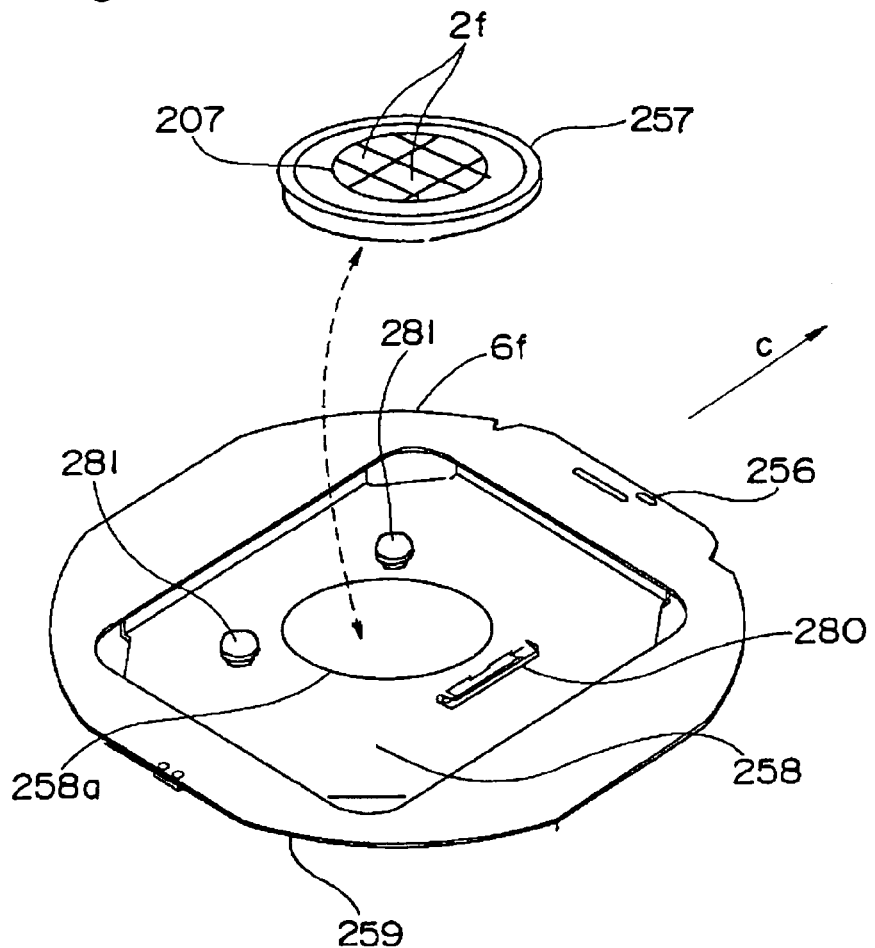
FIG. 23 is a schematic perspective view showing the expanded wafer feeding plate in FIG. 22 with an expanded wafer holding ring being removed.

FIG. 23 shows the expanded wafer feeding plate 6f shown in FIG. 22 in the state that the expanded wafer holding ring placed on the expanded wafer feeding plate 6f is removed, as well as the expanded wafer holding ring.

As shown in FIG. 23, the expanded wafer feeding plate 6f is composed of a ring plate 259 which is a ring-shaped plate having an outer circumferential shape almost identical to the wafer ring 9 and the tray ring 59 and which has an almost square-shaped inner circumferential hole portion, and a placement portion 258 formed in the state of being mounted on the inner circumferential hole portion of the ring plate 259 for detachably carrying an expanded wafer holding ring 257. The placement portion 258 is formed so as to be one-step lower than the ring plate 259, that is, the placement portion 258 is formed so that the height position of the upper face of a wafer feed component 2f disposed on the expanded wafer holding ring 257 when the expanded wafer holding ring 257 is placed thereon is almost identical to the surface height position of the ring plate 259. With such formation, the height position of the wafer feed component 2f on the expanded wafer feeding plate 6f can be made almost identical to the height position of the tray feed components 2t on the tray feeding plate 6t and to the height position of the wafer feed components 2w on the wafer feeding plate 6w. It is to be noted that without being limited to the case in which the ring plate 259 and the placement portion 258 are separately formed and the placement portion 258 is fitted into the inside of the ring plate 259, the present invention may include the case in which the ring plate 259 and the placement portion 258 are formed in an integrated state.

Moreover, as shown in FIG. 23, in the vicinity of the center of the placement portion 258 in the expanded wafer feeding plate 6f, a hole portion 228a is formed so as to be congruent with disposition and the size of a wafer 207 to be disposed on the expanded wafer holding ring 257. The hole portion is to allow respective wafer feed components 2f to be pushed up from the lower side of the expanded wafer feeding plate 6f with the expanded wafer holding ring 257 disposed thereon when the expanded wafer feeding plate 6f is fed to the plate placement device 12 for component feeding.

Moreover, as shown in FIG. 23, the expanded wafer holding ring 257 has the diced wafer 207 disposed on its upper face, and further, the wafer 207 is kept in an expanded state in this disposed state. Moreover, a position in the vicinity of the end portion of the ring plate 259 on a plate extraction direction C side on the expanded wafer feeding plate 6f is a position where the expanded wafer feeding plate 6f is held by a plate moving device 40, and an identification hole 256 for distinguishing the expanded wafer feeding plate 6f from other types of plate 6 is also formed at this portion. It is to be noted that the identification hole 256 is formed at a position different from the identification hole 56 provided on the tray feeding plate 6t.

Moreover, as shown in FIG. 23, a plurality of holding members for retaining the disposed position of the expanded wafer holding ring 257 are mounted on the placement portion 258 in the expanded wafer feeding plate 6f. The respective holding members are of two types: one is a fixed-side holding member 281 for fixing the disposed position of the expanded wafer holding ring 257, upon coming into and engaging with the end portion of the expanded wafer holding ring 257, in the direction which is along the surface of the expanded wafer holding ring 257 and which is the contact direction; and the other is a sliding-side holding member 280 which is a holding member for holding the end portion of the expanded wafer holding ring 257 while biasing the expanded wafer holding ring 257 toward the fixed-side holding member 281 and which is slidable while its holding position is supported by an elastic member. It is to be noted that since the expanded wafer holding ring 257 is in an almost circular shape, two fixed-side holding members 281 are provided so that the expanded wafer holding ring 257 can be held at not less than three points.

Figure 24A:
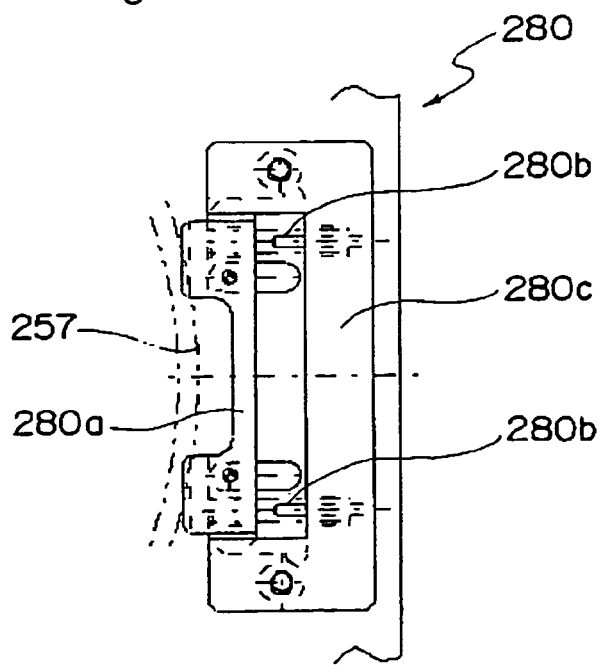
FIG. 24A is a schematic enlarged plane view showing a sliding-side holding member included in the expanded wafer feeding plate.
Figure 24B:
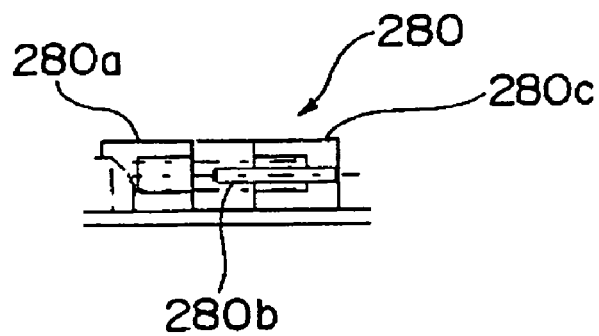
FIG. 24B is a schematic enlarged side view showing the sliding-side holding member in FIG. 24A.

Herein, an enlarged plane view of the sliding-side holding member 280 is shown in FIG. 24A, and its side view is shown in FIG. 24B. As shown in FIG. 24A and FIG. 24B, the sliding-side holding member 280 includes a sliding portion 280a which comes into contact with the end portion of the expanded wafer holding ring 257 and whose contact position is moved in a sliding manner, and a sliding support portion 280c for holding the sliding portion 280a via an elastic member 280b. Moreover, the sliding portion 280a in the state of being in contact with the expanded wafer holding ring 257 is slid rightward as viewed in the drawing, and in this state, the end portion can be biased leftward as viewed in the drawing by the elastic member 280b.

Figure 25:
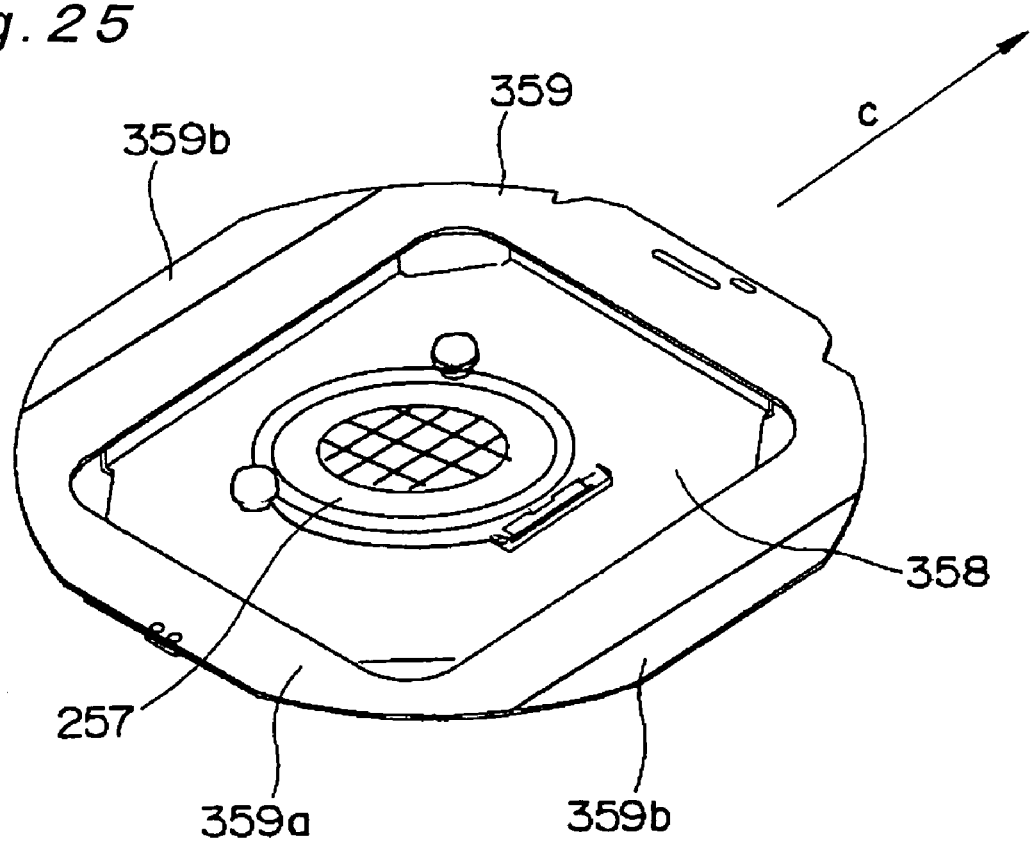
FIG. 25 is a schematic perspective view showing an expanded wafer feeding plate according to a modified example of the second embodiment.
Figure 26:
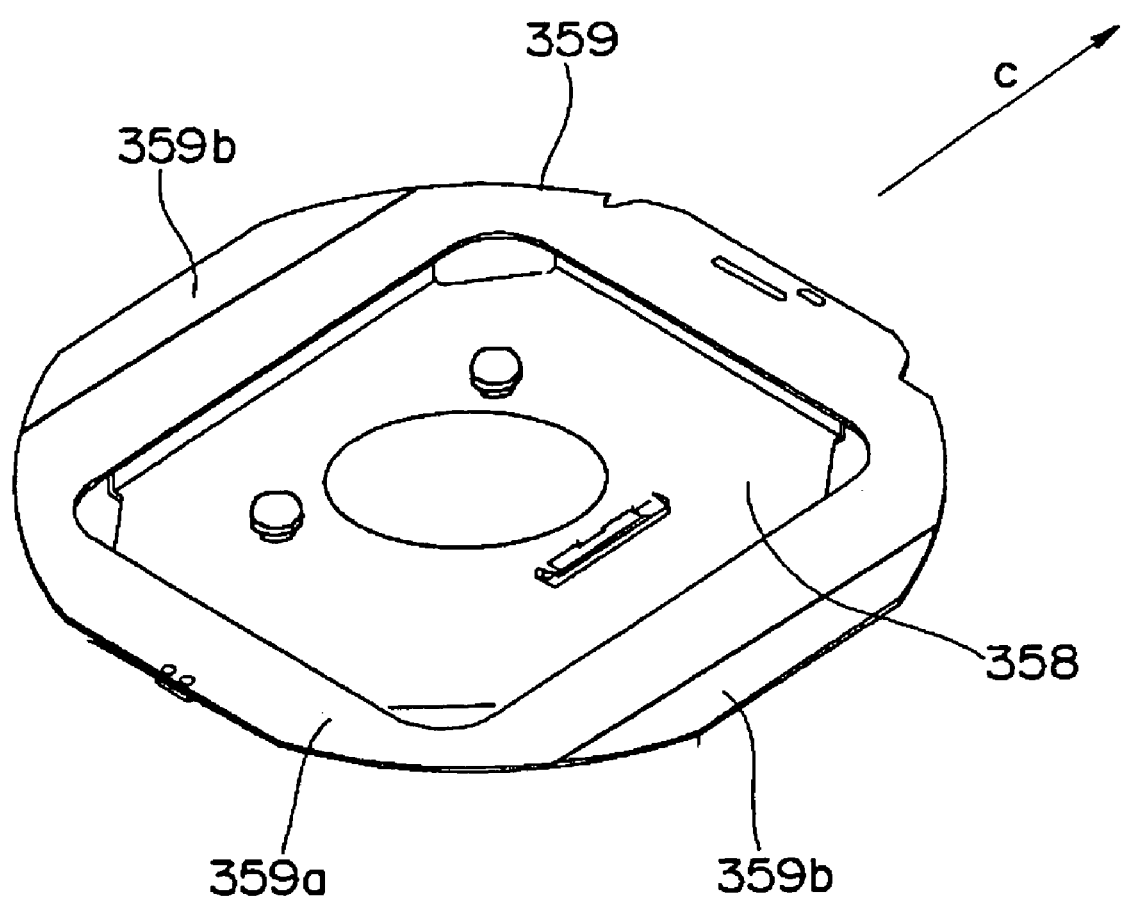
FIG. 26 is a schematic perspective view showing the expanded wafer feeding plate in FIG. 25 with an expanded wafer holding ring being removed.

Moreover, without being limited to the structure disclosed, such an expanded wafer feeding plate 6f may have various structures. Instead of the structure disclosed, the expanded wafer feeding plate 6f may have a structure, as shown in FIG. 25 and FIG. 26 for example, in which a ring plate 359 includes a main portion 359a for supporting a placement portion 358 and end portions 358b disposed along the plate extraction direction c. In such a case, forming the respective end portions 358b supported in the magazine cassette 50 from resins such as PEEK resins and forming the main portion 359a from aluminum make it possible to obtain such an effect that a production amount of chips and like produced by contact wear between the recess portions of the magazine cassette normally formed from aluminum and the end portions 358b of the ring plate 359 formed from resins can be reduced without preparing special specification for the magazine cassette which requires versatility.

Description is now given of the procedures of feeding respective wafer feed components 2f from the thus-structured expanded wafer feeding plate 6f.

First, an expanded wafer feeding plate 6f is selected from the respective plates 6 housed in the magazine cassette 50, and the expanded wafer feeding plate 6f is extracted and transported to the plate placement device 12 by the plate moving device 40.

The expanded wafer feeding plate 6f disposed on the plate placement device 12 is supported by respective plate support portions 60 and plate presser members 61 at a plate feeding/discharging height position H3. Then, the respective plate presser members 61 are lowered by a presser member up/down unit 62, and their lowered height positions are regulated by intermediate stoppers 69d disposed on the contact positions, so that as shown in FIG. 27, the expanded wafer feeding plate 6f is positioned at a tray plate holding height position, i.e., a slack removal processing height position H2.

Figure 27:
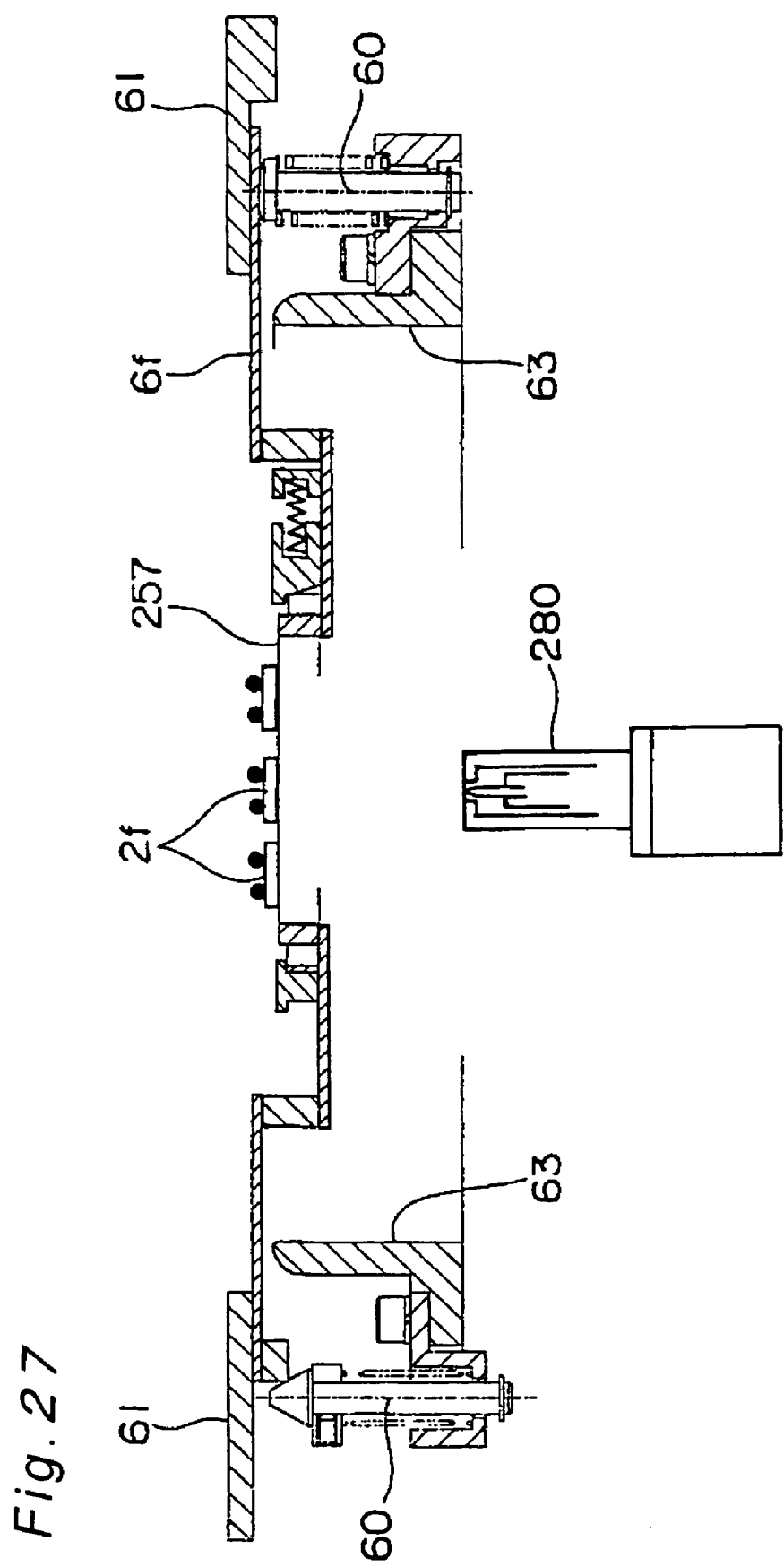
FIG. 27 is a schematic explanatory view showing a wafer feed component being fed from the expanded wafer feeding plate in a plate placement device.
Figure 28A:
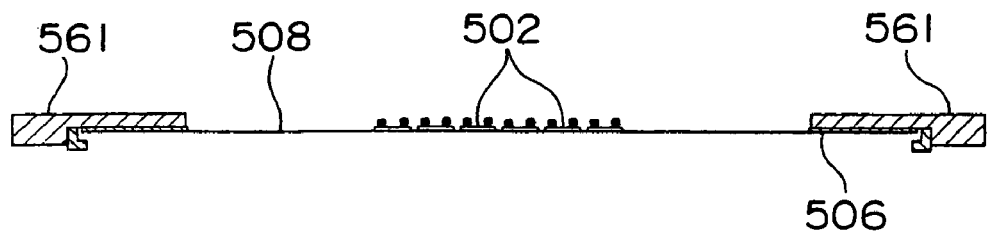
FIG. 28A is a schematic explanatory view sowing expanding operation targeting a conventional wafer, the view showing the state before the start of expansion.
Figure 28B:
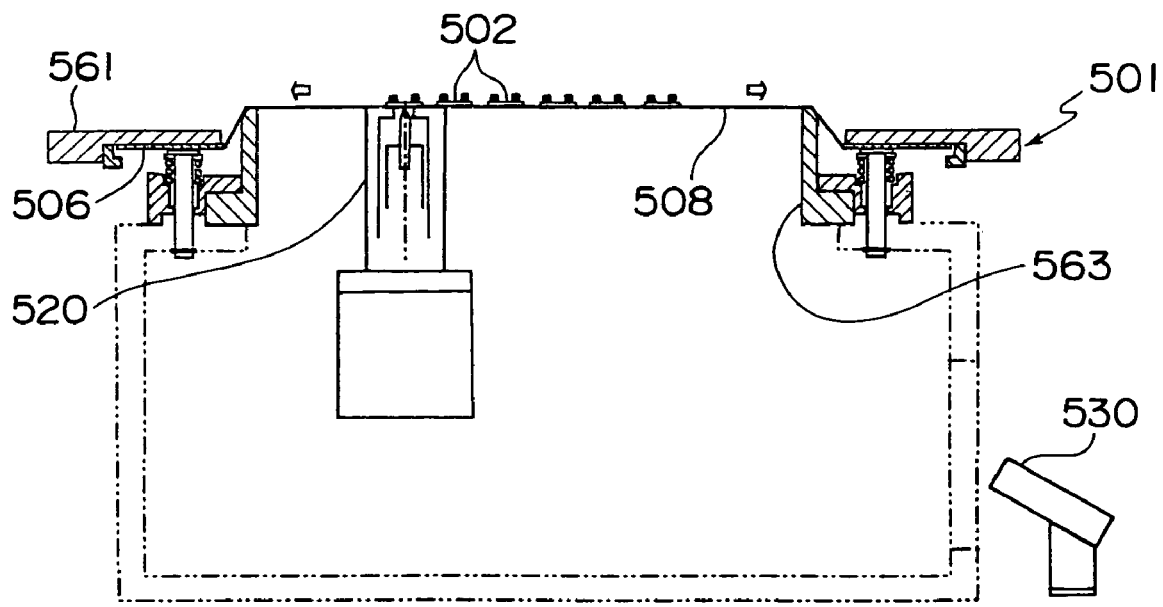
FIG. 28B is a schematic explanatory view showing expanding operation targeting the conventional wafer, the view showing the state during the expanding operation.
Figure 29:
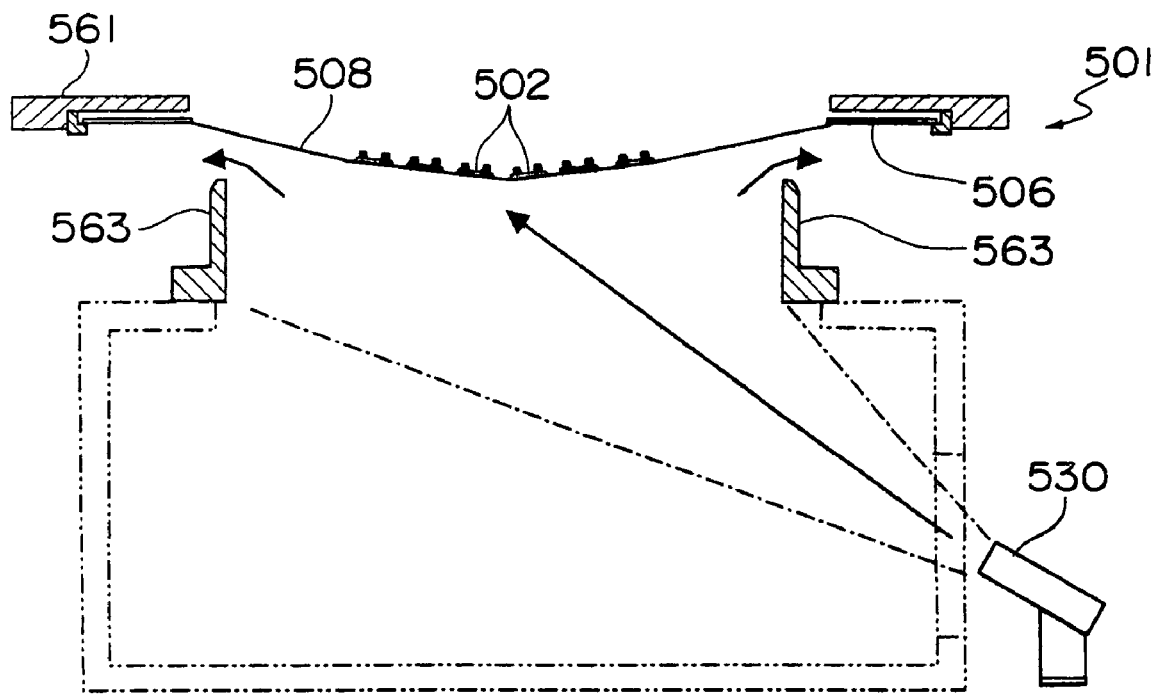
FIG. 29 is a schematic explanatory view showing the start of the slack removal processing applied to a conventional expanded wafer sheet.
Figure 30:
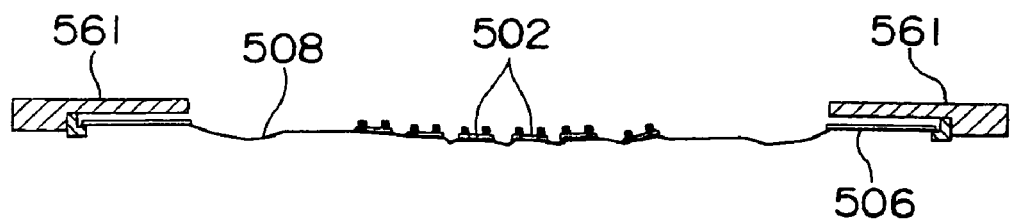
FIG. 30 is a schematic explanatory view showing residual slack on the conventional wafer sheet after application of the slack removal processing.

As shown in FIG. 27, with the expanded wafer feeding plate 6f being held at such a height position, wafer feed components 2f disposed on the expanded wafer holding ring 257 are pushed up by a push-up device 280, by which feeding of the wafer feed component 2f is performed.

It is to be noted that after completion of component feeding, the expanded wafer feeding plate 6f is lifted to a plate feeding/discharging height position H3 and is housed in the magazine cassette 50.

According to the second embodiment, in the case where a component feeding pattern involving the expanded wafer feeding plate 6f is further added to a component feeding pattern involving the wafer feeding plate 6w and the tray feeding plate 6t, selective use of three plate support height positions in the plate placement device 12, i.e., the plate feeding/discharging height position H3, the slack removal processing height position (tray plate holding height position) H2, and the expanding height position H1, allows reliable and efficient implementation of the component feeding pattern in conformity with the respective plates 6. Further, with such feeding patterns, the slack removal processing of the wafer sheet 8 on the wafer feeding plate 6w can reliably and efficiently be executed, which makes it possible to achieve efficient component feeding.

It is to be noted that, by properly combining the arbitrary embodiments of the aforementioned various embodiments, the effects possessed by them can be produced.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The disclosure of Japanese Patent Application No. 2004-153242 filed on May 24, 2004 including specification, drawing and claims are incorporated herein by reference in its entirety.

The invention claimed is:

1. A wafer expanding device for performing expansion of a wafer sheet held by a wafer feeding plate and having a plurality of wafer feed components, which are formed through dicing of a wafer, attached thereto, and for making the plurality of wafer feed components feedable from the wafer sheet, the wafer expanding device comprising:
   a ring member for expanding the wafer sheet substantially radially, the ring member having an upper end portion;
   a plate moving device for holding the wafer feeding plate above the ring member, lowering the wafer feeding plate relative to the ring member, and lifting the wafer feeding plate relative to the ring member, wherein lowering the wafer feeding plate causes an expansion of the wafer sheet by depressing a lower face of the wafer sheet against the upper end portion of the ring member; and
   a heating blower device for blowing heated air through an inside of the ring member to the lower face of the wafer sheet so as to remove slack in the wafer sheet generated by the expansion;
   wherein the plate moving device is operable to hold the wafer feeding plate at a plurality of height positions, the plurality of height positions including:
   a first height position for feeding and discharging the wafer feeding plate and preventing interference with the ring member,
   a second height position for expanding the wafer sheet, and
   a third height position for removing the slack in the wafer sheet with the heating blower device and avoiding contact between the wafer sheet and the upper end portion of the ring member when removal of the slack is completed.

2. The wafer expanding device as defined in claim 1, wherein the third height position is disposed such that a vertical distance between the wafer feeding plate and the upper end portion of the ring member forms a gap between the wafer sheet and the upper end portion of the ring member when the slack is removed from the wafer sheet.

3. The wafer expanding device as defined in claim 2, wherein the upper end portion of the ring member is bent toward an inside of the ring member such that escape of the heated air though the gap is reduced.

4. The wafer expanding device as defined in claim 2, wherein the gap is 0.2 mm to 1.5 mm in width.

5. The wafer expanding device as defined in claim 1, wherein the plate moving device comprises:
   a plurality of elastic support members disposed near an outer peripheral portion of the plate moving device for supporting the wafer feeding plate at the first height position, the plurality of elastic support members having a plurality of supporting positions;
   a plate presser member for pressing the wafer feeding plate supported by the plurality of elastic support members, the plate presser member contacting an outer peripheral portion of an upper face of the wafer feeding plate;
   a presser member moving unit for lifting and lowering the plate presser member such that the wafer feeding plate held by the plate presser member is lifted and lowered between the first height position and the second height position, and
   a regulating member for selectively regulating a vertical position of the plate presser member such that the wafer feeding plate is positioned in at least one of the first height position, the second height position, and the third height position.

6. A component feeder for housing a plurality of components to be mounted on a board and feeding the plurality of components in such a way as to allow component mounting, the plurality of components including wafer feed components and tray feed components, the component feeder comprising:
   a plate storage device for retrievably housing a plurality of wafer feeding plates and a plurality of tray feeding plates, the wafer feeding plate for carrying a plurality of wafers on which a plurality of the wafer feed components are disposed and the plurality of tray feeding plates for carrying component feeding trays on which a plurality of the tray feed components are disposed;
   a plate placement device for selectively placing and holding a wafer feeding plate of the plurality of wafer feeding plates or a tray feeding plate of the plurality of tray feeding plates so as to allow feeding of the plurality of components; and
   a plate moving device for releasably holding and moving the wafer feeding plate or the tray feeding plate between the plate storage device and the plate placement device;
   wherein the plate placement device comprises:
   a wafer expanding device for performing expansion of a wafer sheet held by a wafer feeding plate and having a plurality of wafer feed components, which are formed through dicing of a wafer, attached thereto, and for making the plurality of wafer feed components feedable from the wafer sheet, the wafer expanding device comprising:
   a ring member for expanding the wafer sheet substantially radially, the ring member having an upper end portion,
   a plate moving device for holding the wafer feeding plate above the ring member, lowering the wafer feeding plate relative to the ring member, and lifting the wafer feeding plate relative to the ring member, wherein lowering the wafer feeding plate causes an expansion of the wafer sheet by depressing a lower face of the wafer sheet against the upper end portion of the ring member, and
   a heating blower device for blowing heated air through an inside of the ring member to the lower face of the wafer sheet so as to remove slack in the wafer sheet generated by the expansion,
   wherein the plate moving device is operable to hold the wafer feeding plate at a plurality of height positions, the plurality of height positions including:
   a first height position for feeding and discharging the wafer feeding plate and preventing interference with the ring member,
   a second height position for expanding the wafer sheet, and
   a third height position for removing the slack in the wafer sheet with the heating blower device and avoiding contact between the wafer sheet and the upper end portion of the ring member when removal of the slack is completed;
   wherein the plate moving device comprises:
   a plurality of elastic support members disposed near an outer peripheral portion of the plate moving device for supporting the wafer feeding plate at the first height position, the plurality of elastic support members having a plurality of supporting positions;
   a plate presser member for pressing the wafer feeding plate supported by the plurality of elastic support members, the plate presser member contacting an outer peripheral portion of an upper face of the wafer feeding plate;
   a presser member moving unit for lifting and lowering the plate presser member such that the wafer feeding plate held by the plate presser member is lifted and lowered between the first height position and the second height position, and a regulating member for selectively regulating a vertical position of the plate presser member such that the wafer feeding plate is positioned in at least one of the first height position, the second height position, and the third height position; and wherein the plate placement device is operable to position the plate presser member such that the tray feeding plate is held in the third height position.

7. The component feeder as defined in claim 6, wherein the plate storage device houses expanded wafer feeding plates for carrying expanded wafers, and the plate placement device is operable to regulate a lowering position of the plate presser member with the regulating section to position the expanded wafer feeding plate held by the plate presser member at the third height position so as to make the plurality of wafer feed components from the plate feedable.

8. An expanding method for a wafer sheet comprising:

providing the wafer sheet on which a plurality of wafer feed components are attached, the wafer sheet being held in a wafer feeding plate;

disposing the wafer feeding plate at a first height position, the first height position being above a ring member;

lowering the wafer feeding plate to a second height position such that the wafer sheet contacts an upper end portion of the ring member to expand the wafer sheet substantially radially;

lifting the wafer feeding plate to a third height position, the third height position being between the first height position and the second height position, and removing slack in the wafer sheet by blowing heat on a lower face of the wafer sheet through an inside of the ring member while the wafer feeding plate is in the third height position, wherein the third height position is disposed such that the wafer sheet does not contact the upper end portion of the ring member when said removing slack operation is completed.

9. The expanding method for a wafer sheet as defined in claim 8, wherein the third height position is disposed such that a vertical distance between the wafer feeding plate and the upper end portion of the ring member provides a gap between the wafer sheet and the upper end portion of the ring member when the slack is removed from the wafer sheet.

10. The expanding method for a wafer sheet as defined in claim 9, wherein the gap is 0.2 mm to 1.5 mm in width.

* * * * *